United States Patent
Kim

(10) Patent No.: US 10,210,932 B2
(45) Date of Patent: *Feb. 19, 2019

(54) ELECTRONIC DEVICE WITH SEMICONDUCTOR MEMORY HAVING VARIABLE RESISTANCE ELEMENTS FOR STORING DATA AND ASSOCIATED DRIVING CIRCUITRY

(71) Applicant: SK hynix Inc., Icheon-Si (KR)

(72) Inventor: Dong-Keun Kim, Icheon-Si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/802,244

(22) Filed: Nov. 2, 2017

(65) Prior Publication Data

US 2018/0075905 A1    Mar. 15, 2018

Related U.S. Application Data

(63) Continuation of application No. 14/503,100, filed on Sep. 30, 2014, now Pat. No. 9,812,199.

(30) Foreign Application Priority Data

Apr. 25, 2014    (KR) .................. 10-2014-0050034

(51) Int. Cl.
  *G11C 13/00*    (2006.01)
  *G11C 11/16*    (2006.01)

(52) U.S. Cl.
  CPC ........ *G11C 13/0069* (2013.01); *G11C 11/161* (2013.01); *G11C 11/1659* (2013.01)

(58) Field of Classification Search
  CPC . G11C 2213/79; G11C 11/22; G11C 13/0069; G11C 11/161; G11C 11/1659
  See application file for complete search history.

(56) References Cited

U.S. PATENT DOCUMENTS

| | | |
|---|---|---|
| 5,029,136 A | 7/1991 | Tran et al. |
| 5,297,092 A | 3/1994 | Johnson |
| 5,552,728 A | 9/1996 | Lin |
| 5,936,898 A | 8/1999 | Chi |
| 7,016,222 B2 | 3/2006 | Morikawa |

(Continued)

FOREIGN PATENT DOCUMENTS

| | | |
|---|---|---|
| KR | 10-2008-0046123 | 5/2008 |
| KR | 10-2015-0117494 | 10/2015 |

*Primary Examiner* — Douglas King
(74) *Attorney, Agent, or Firm* — Perkins Coie LLP

(57) ABSTRACT

Provided are, among others, memory circuits or devices and their applications in electronic devices or systems and various implementations of an electronic device which includes a semiconductor memory unit including one or more column, a data line, and a data line bar connected with a column selected among the one or more columns. Each of the one or more columns may include a plurality of storage cells each configured to store 1-bit data, each storage cell including a first and a second variable resistance elements; a bit line connected to one end of the first variable resistance element; a bit line bar connected to one end of the second variable resistance element; a source line connected to the other ends of the first and second variable resistance elements; and a driving block configured to latch data of the data line and the data line bar.

18 Claims, 14 Drawing Sheets

(56) References Cited

U.S. PATENT DOCUMENTS

| | | | |
|---|---|---|---|
| 8,432,727 | B2 | 4/2013 | Ryu et al. |
| 9,147,458 | B2 | 9/2015 | Noguchi et al. |
| 2002/0057593 | A1 | 5/2002 | Hidaka |
| 2003/0142527 | A1 | 7/2003 | Yamada |
| 2004/0136253 | A1 | 7/2004 | Gupta et al. |
| 2007/0159870 | A1 | 7/2007 | Tanizaki et al. |
| 2010/0091549 | A1 | 4/2010 | Lee et al. |
| 2011/0084348 | A1 | 4/2011 | Kuribayashi et al. |
| 2011/0199840 | A1* | 8/2011 | Kajigaya ............ G11C 5/025 365/189.15 |
| 2011/0211390 | A1 | 9/2011 | Hanzawa et al. |
| 2012/0194222 | A1 | 8/2012 | Hoefler et al. |
| 2012/0243297 | A1 | 9/2012 | Katayama et al. |
| 2013/0322161 | A1 | 12/2013 | Noguchi et al. |
| 2015/0294704 | A1 | 10/2015 | Bae et al. |
| 2016/0064047 | A1 | 3/2016 | Tiwari |

\* cited by examiner

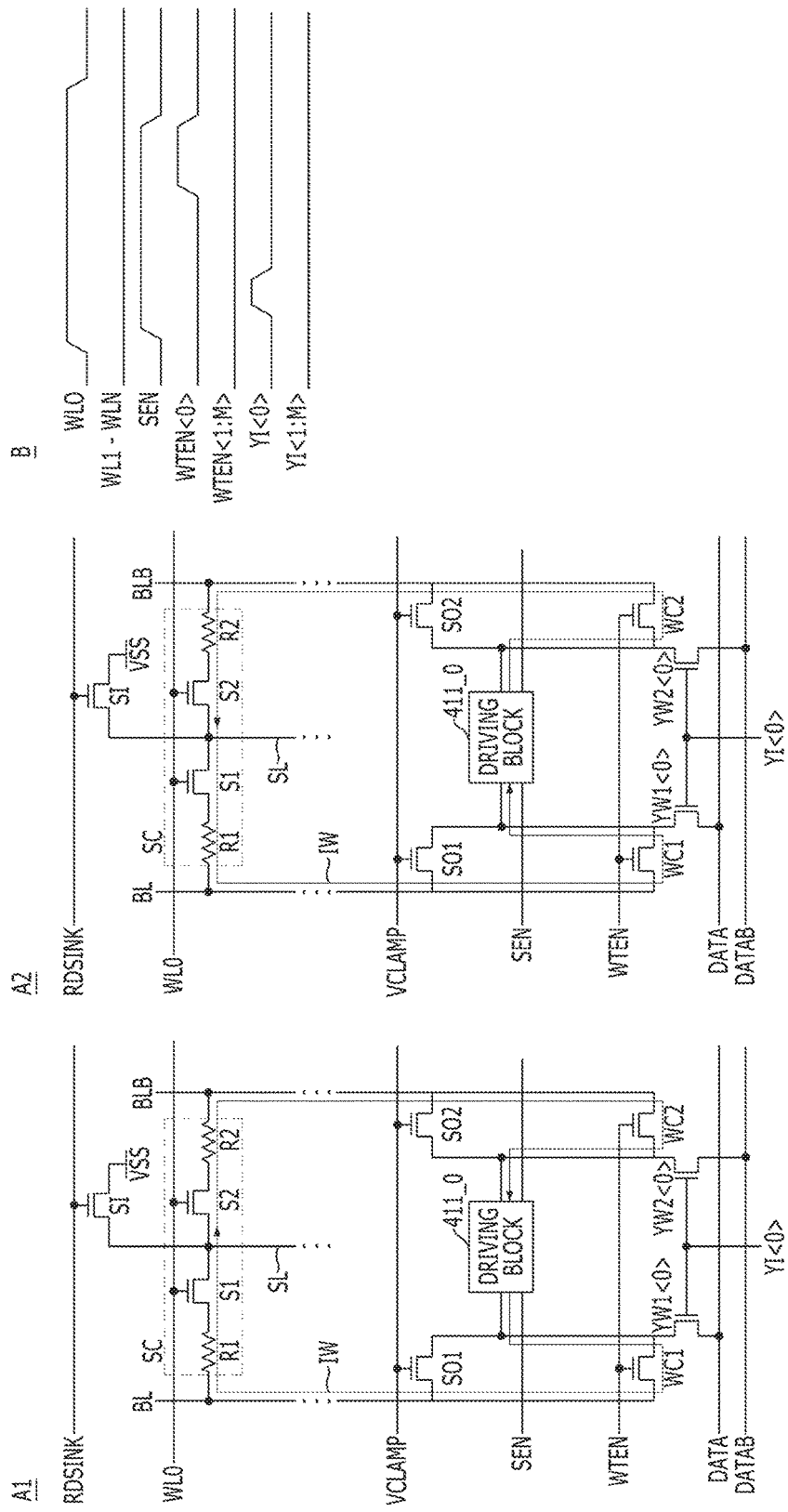

ELECTRONIC DEVICE WITH SEMICONDUCTOR MEMORY HAVING VARIABLE RESISTANCE ELEMENTS FOR STORING DATA AND ASSOCIATED DRIVING CIRCUITRY

CROSS-REFERENCE TO RELATED APPLICATIONS

This patent document is a continuation of, and claims priority and benefits of, U.S. patent application Ser. No. 14/503,100, published as US 2015/0310914 A1, entitled "ELECTRONIC DEVICE," and filed on Sep. 30, 2014, which further claims priority of Korean Patent Application No. 10-2014-0050034, entitled "ELECTRONIC DEVICE" and filed on Apr. 25, 2014. The contents of the before-mentioned patent applications (including US 2015/0310914 A1) are incorporated herein by reference in their entirety as part of the disclosure of this document.

BACKGROUND

1. Field

This patent document relates to memory circuits or devices and their applications in electronic devices or systems.

2. Description of the Related Art

Recently, as electronic devices or appliances trend toward miniaturization, low power consumption, high performance, multi-functionality, and so on, there is a demand for semiconductor or electronic devices capable of storing information in various electronic devices or appliances such as a computer, a portable communication device, and so on, and research and development for such electronic devices have been conducted. Examples of such semiconductor or electronic devices include electronic devices which can store data using a characteristic that they are switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

Various implementations are directed to an electronic device in which a storage cell includes two variable resistance elements, thereby increasing the margin and speed of read and write operations.

Also, various implementations are directed to an electronic device in which the degree of integration of storage cells each including two variable resistance elements is increased.

In one aspect, an electronic device is provided to include a semiconductor memory unit which includes: one or more columns; and a data line and a data line bar connected with a column selected among the one or more columns. Each of the one or more columns may include a plurality of storage cells each configured to store 1-bit data, each storage cell including a first variable resistance element which has a first resistance value when a first value is stored therein and a second resistance value when a second value is stored therein and a second variable resistance element which has the second resistance value when the first value is stored therein and the first resistance value when the second value is stored therein; a bit line connected to one end of the first variable resistance element; a bit line bar connected to one end of the second variable resistance element; a source line connected to the other ends of the first and second variable resistance elements; and a driving block configured to latch data of the data line and the data line bar when a corresponding column is selected, the driving block configured to, in a write operation, drive the bit line and the bit line bar with a first voltage and a second voltage based on a value of the latched data, and the driving block further configured to, in a read operation, latch data corresponding to a current flowing through the bit line and the bit line bar.

In some implementations, in the write operation, resistance values of the first variable resistance element and the second variable resistance element may be switched according to directions of currents flowing through the first variable resistance element and the second variable resistance element, respectively.

In some implementations, in the read operation, the driving block may latch the first value when an amount of a current flowing through the bit line is larger than an amount of a current flowing through the bit line bar, and latch the second value when an amount of a current flowing through the bit line is smaller than an amount of a current flowing through the bit line bar.

In some implementations, each of the plurality of storage cells may include: a first selection element connected between the first variable resistance element and the source line, and configured to be turned on or off in response to a voltage of a corresponding word line; and a second selection element connected between the second variable resistance element and the source line, and configured to be turned on or off in response to the voltage of the corresponding word line.

In some implementations, each of the one or more columns may include: a first driving line connected to one end of the driving block, and configured to be connected with the data line when a corresponding column is selected; and a second driving line connected to the other end of the driving block, and configured to be connected with the data line bar when the corresponding column is selected, wherein the driving block drives the bit line through the first driving line and drives the bit line bar through the second driving line.

In some implementations, when activated, the driving block may drive the first driving line with one voltage of the first voltage and the second voltage and drive the second driving line with the other voltage, and when deactivated, the driving block may precharge the first driving line and the second driving line with one voltage of the first voltage and the second voltage.

In some implementations, in the write operation, the driving block may drive the first driving line with the first voltage and the second driving line with the second voltage when the value of the latched data is the first value, and drive the first driving line with the second voltage and the second driving line with the first voltage when the value of the latched data is the second value.

In some implementations, in the read operation, the driving block may drive the first driving line and the second driving line with the first voltage and the second voltage, respectively, when the amount of current flowing through the bit line is larger than the amount of current flowing through the bit line bar, and drive the first driving line and the second driving line with the second voltage and the first voltage, respectively, when the amount of current flowing through the bit line is smaller than the amount of current flowing through the bit line bar.

In some implementations, the source line may be floated in the write operation and is applied with a ground voltage in the read operation.

In some implementations, one or more storage cells of the plurality of storage cells may be sequentially disposed on one side of the driving block, and remaining storage cells may be sequentially disposed on the other side of the driving block.

In some implementations, the driving block may include: a first PMOS transistor having one end which is connected to the first driving line and the other end which is applied with a power supply voltage, and configured to be turned on and off in response to a voltage of the second driving line; a second PMOS transistor having one end which is connected to the second driving line and the other end which is applied with the power supply voltage, and configured to be turned on and off in response to a voltage of the first driving line; a first NMOS transistor having one end which is connected to the first driving line and the other end which is connected to an internal node, and configured to be turned on and off in response to the voltage of the second driving line; a second NMOS transistor having one end which is connected to the second driving line and the other end which is connected to the internal node, and configured to be turned on and off in response to the voltage of the first driving line; and a third NMOS transistor having one end which is connected to the internal node and the other end which is applied with the ground voltage, and configured to be turned on and off in response to an enable signal which is activated during an activation period of the driving block and is deactivated during a deactivation period of the driving block.

In some implementations, each of the one or more columns may include: a first sourcing connection element connected between the bit line and the first driving line, and configured to be turned on or off in response to a clamp signal; a second sourcing connection element connected between the bit line bar and the second driving line, and configured to be turned on or off in response to the clamp signal; and a sinking connection element connected between the source line and a terminal of the ground voltage, and configured to be turned on or off in response to a read sinking signal, wherein the clamp signal and the read sinking signal are activated during a period in which data of a selected storage cell is latched to the driving block.

In some implementations, each of the one or more columns may include: a first write connection element connected between the bit line and the first driving line, and configured to be turned on in the write operation; and a second write connection element connected between the bit line bar and the second driving line, and configured to be turned on in the write operation.

In some implementations, each of the one or more columns may include: a first column selection element connected between the first driving line and the data line, and configured to be turned on or off in response to a corresponding column select signal; and a second column selection element connected between the second driving line and the data line bar, and configured to be turned on or off in response to the corresponding column select signal.

In some implementations, the driving block may drive both ends with same voltage level during a precharge period.

In some implementations, the driving block may further include: a third PMOS transistor having one end which is connected to the first driving line and the other end which is connected to the second driving line, and configured to be turned on and off in response to the enable signal.

In some implementations, the third PMOS transistor may turn off when the enable signal is activated, and turn on when the enable signal is deactivated.

In some implementations, the first variable resistance element and the second variable resistance element may include a metal oxide and have a structure in which a tunnel barrier layer is interposed between two ferromagnetic layers.

In some implementations, the electronic device further comprises a microprocessor which includes: a control unit that is configured to receive a signal including a command from an outside of the microprocessor, and performs extracting, decoding of the command, or controlling input or output of a signal of microprocessor; and an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

In some implementations, the electronic device further comprises a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

In some implementations, the electronic device further comprises a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the variable resistance element is part of the auxiliary memory device or the main memory device in the processing system.

In some implementations, the electronic device further comprises a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

In some implementations, the electronic device may further include a memory system which includes a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

In another aspect, an electronic device is provided to include a semiconductor memory unit which includes: a cell array including a plurality of storage cells which are connected with the first bit lines and first bit line bars or with second bit lines and second bit line bars, wherein the first bit lines and the first bit line bars are disposed on a first side of the cell array and the second bit lines and the second bit line bars are disposed on a second side of the cell array, and each storage cell stores 1-bit data and includes a first variable resistance element having a first resistance value when a first value is stored therein and a second resistance value when a second value is stored therein and a second variable resistance element having the second resistance value when the first value is stored therein and the first resistance value when the second value is stored therein; a first data line and a first data line bar disposed on the first side of the cell array; a second data line and a second data line bar disposed on the second side of the cell array; one or more first driving blocks disposed on the first side of the cell array and connected to the storage cells through the first bit lines and the first bit line bars, each driving block configured, during a write operation, to latch data of a corresponding first data line and a corresponding first data line bar and drive the corresponding first bit line and the corresponding first bit line bar with a first voltage or a second voltage according to a value of the latched data and configured, during a read operation, latch data stored in a corresponding storage cell based on a current flowing through the corresponding first bit line and the corresponding first bit line bar; and one or more second driving blocks disposed on the second side of the cell array, and connected to storage cells through the second bit lines and the second bit line bars, each second driving block configured, during a write operation, to latch data of a corresponding second data line and a corresponding second data line bar and drive the corresponding second bit line and the corresponding second bit line bar with a first voltage or a second voltage according to a value of the latched data and configured, during a read operation to latch data stored in a corresponding storage cell based on current flowing through the corresponding second bit line and the corresponding second bit line bar.

In some implementations, the semiconductor memory unit may include: a plurality of source lines to which a ground voltage is applied during the read operation and are floated during the write operation, and wherein one end of each first variable resistance element is connected to a corresponding bit line, one end of each second variable resistance element is connected to a corresponding bit line bar, and the other ends of the first and second variable resistance elements are connected to a corresponding source line.

In some implementations, in the write operation, resistance values of the first variable resistance element and the second variable resistance element may be switched to the first resistance value when current flows from the other ends to the one ends and be switched to the second resistance value when current flows from the one ends to the other ends.

In some implementations, the at least one first driving block and the at least one second driving block may latch the first value when an amount of current flowing thorough the bit line is larger than an amount of current flowing through the bit line bar, and latch the second value when an amount of current flowing thorough the bit line is smaller than an amount of current flowing through the bit line bar.

In some implementations, each driving block may be further connected to a first driving line and a second driving line on both ends thereof, respectively, and configured such that, when a corresponding driving block is selected, the first driving line and the second driving line are connected with a corresponding data line and a corresponding data line bar, respectively, and wherein the driving block drives the bit line through the first driving line and the bit line bar through the second driving line.

In some implementations, in the write operation, each first driving block and each second driving block may drive the first driving line with the first voltage and the second driving line with the second voltage when the value of the latched data is the first value, and drive the first driving line with the second voltage and the second driving line with the first voltage when the value of the latched data is the second value.

In some implementations, in the read operation, each first driving block and each second driving block may drive the first driving line and the second driving line with the first voltage and the second voltage, respectively, when the amount of current flowing through the bit line is greater than the amount of current flowing through the bit line bar, and drive the first driving line and the second driving line with the second voltage and the first voltage, respectively, when the amount of current flowing through the bit line is smaller than the amount of current flowing through the bit line bar.

In some implementations, each of the first and second driving blocks may drive both ends with same voltage level during a precharge period.

In some implementations, each of the first and second driving blocks may include: a first PMOS transistor having one end which is connected to the first driving line and the other end which is applied with a power supply voltage, and configured to be turned on and off in response to a voltage of the second driving line; a second PMOS transistor having one end which is connected to the second driving line and the other end which is applied with the power supply voltage, and configured to be turned on and off in response to a voltage of the first driving line; a first NMOS transistor having one end which is connected to the first driving line and the other end which is connected to an internal node, and configured to be turned on and off in response to the voltage of the second driving line; a second NMOS transistor having one end which is connected to the second driving line and the other end which is connected to the internal node, and configured to be turned on and off in response to the voltage of the first driving line; a third NMOS transistor having one end which is connected to the internal node and the other end which is applied with the ground voltage, and configured to be turned on and off in response to an enable signal which is activated during an activation period of the driving block and is deactivated during a deactivation period of the driving block; and a third PMOS transistor having one end which is connected to the first driving line and the other end which is connected to the second driving line, and configured to be turned on and off in response to the enable signal.

In some implementations, the third PMOS transistor may turn off when the enable signal is activated, and turn on when the enable signal is deactivated.

In some implementations, the first variable resistance element and the second variable resistance element may include at least one of a metal oxide and a structure in which a tunnel barrier layer is interposed between two ferromagnetic layers.

In some implementations, the electronic device further comprises a microprocessor which includes: a control unit that is configured to receive a signal including a command from an outside of the microprocessor, and performs extracting, decoding of the command, or controlling input or output of a signal of microprocessor; and an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

In some implementations, the electronic device further comprises a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

In some implementations, the electronic device further comprises a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the variable resistance element is part of the auxiliary memory device or the main memory device in the processing system.

In some implementations, the electronic device further comprises a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

In some implementations, the electronic device may further include a memory system which includes a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

In another aspect, there is provided a method of operating an electronic device including a semiconductor memory unit. The method may include: configuring the semiconductor memory unit to include cell arrays with storage cells each storage cell including a first or second data bit value and including first and second variable resistance elements having a first resistance value and a second resistance value and a driving unit connected to a corresponding storage cell, wherein resistance values of the first and the second variable resistance elements are different from each other when storing a particular data bit value therein and are switched between the first resistance value and the second resistance value depending on directions of currents flowing therethrough; performing a read operation at a storage cell by operating the driving unit connected to the storage cell to latch the first or the second data bit value stored in the storage cell based on resistance values of the first and second variable resistance elements; and performing a write operation at a storage cell by controlling directions of currents flowing through the first and second variable resistance elements of the storage cell, respectively, such that the first or second data bit value is written into the storage cell.

In some implementations, the driving units may be disposed on different sides of a corresponding cell array such that storage cells of the corresponding cell array are connected with the driving units on different sides of the corresponding cell array.

In some implementations, the driving units may be disposed between two cell arrays such that storage cells of the two cell arrays are connected to the same driving units.

Those and other aspects of the disclosed technology and their implementations and variations are described in greater detail in the drawings, the description and the claims.

BRIEF DESCRIPTION OF THE DRAWINGS

FIG. 5B is a diagram explaining an example of a write operation of the memory device shown in FIG. 4.

DETAILED DESCRIPTION

Figure 1:
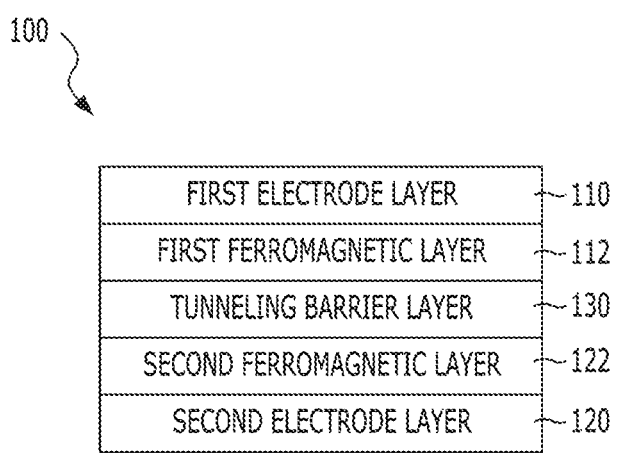
FIG. 1 is a diagram showing an example of a magnetic tunnel junction (MTJ) element as one of structures in which a tunneling barrier layer is interposed between two ferromagnetic layers.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

A semiconductor device in accordance with embodiments may include a variable resistance element. In the following descriptions, a variable resistance element may exhibits a resistance variable characteristic and may include a single layer or a multi-layer. For example, a variable resistance element may include substances used in an RRAM, an MRAM, an FRAM, etc., for example, a transition metal compound, a ferroelectric, a ferromagnetic, and so on. However, the substances or materials suitable for implementing the variable resistance element are not limited to those mentioned above, and other substances or materials may be used for a variable resistance element so that its resistance variable characteristic can be switched between different resistance states according to voltages or current applied to both ends thereof.

For example, a variable resistance element may include a metal oxide. For example, the metal oxide may include a transition metal oxide such as a nickel (Ni) oxide, a titanium (Ti) oxide, a hafnium (Hf) oxide, a zirconium (Zr) oxide, a tungsten (W) oxide and a cobalt (Co) oxide or a perovskite-based substance such as STO (SrTiO) and/or PCMO (PrCaMnO). Such a variable resistance element may exhibit a characteristic that it is switched between different resistance states due to creation and extinction of current filaments through behavior of vacancies.

Further, a variable resistance element may include a structure in which a tunneling barrier layer is interposed between two ferromagnetic layers. The ferromagnetic layers may be formed using a substance such as NiFeCo and CoFe, and the tunneling barrier layer may be formed using a substance such as Al2O3. The variable resistance element may exhibit a characteristic that it is switched between different resistance states according to magnetization directions of the ferromagnetic layers. For example, in the case where the magnetization directions of the two ferromagnetic layers are parallel to each other, the variable resistance element may be in a low resistant state, and, in the case where the magnetization directions of the two ferromagnetic layers are anti-parallel to each other, the variable resistance element may be in a high resistant state.

FIG. 1 is a diagram showing an example of a magnetic tunnel junction (MTJ) element as one of structures in which a tunneling barrier layer is interposed between two ferromagnetic layers.

Referring to FIG. 1, an MTJ element 100 includes a first electrode layer 110 as a top electrode, a second electrode layer 120 as a bottom electrode, a first ferromagnetic layer 112 and a second ferromagnetic layer 122 as a pair of ferromagnetic layers, and a tunneling barrier layer 130 which is formed between the pair of ferromagnetic layers 112 and 122.

The first ferromagnetic layer 112 is a free ferromagnetic layer of which magnetization direction may be changed according to a direction of current applied to the MTJ element 100, and the second ferromagnetic layer 122 is a pinned ferromagnetic layer of which magnetization direction is pinned.

The MTJ element 100 is changed in its resistance value according to a direction of current, and records a data bit value of "0" (a low data bit value) or "1" (a high data bit value).

Figure 2A:
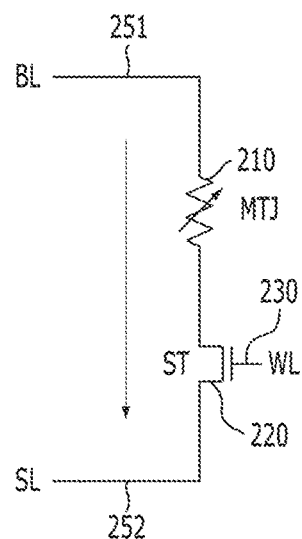
FIGS. 2A and 2B are views explaining an example of an operation for storing data in a variable resistance element.
Figure 2B:
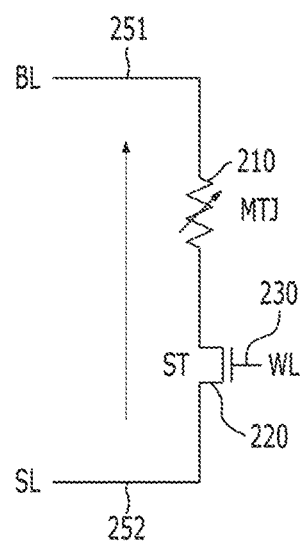

FIGS. 2A and 2B are views explaining a principle of storing data in a variable resistance element 210. The variable resistance element 210 may be the MTJ element 100 described above with reference to FIG. 1. A selecting or switching element 220 is electrically coupled to one side of the MTJ 100 in series to turn on or off the electrical path to the MTJ 100 to select or de-select the MTJ 100, respectively. When the selecting element 220 is turned on, the driving circuit for driving the MTJ 100 can direct a current through the MTJ 100 in one of two opposite directions as illustrated in FIGS. 2A and 2B, respectively. The selecting element 220 can be implemented by various circuit elements or in various circuit configurations to provide the desired electrical switching operation in turning on or off the electrical path to the MTJ 100 and may be, e.g., a transistor or a diode. In the examples illustrated, the selecting element 220 is shown as a transistor.

FIG. 2A is a diagram explaining an example of an operation for recording a low data bit value in the variable resistance element 210. In order to select the variable resistance element 210 in which data is to be stored, a word line 230 that is designated to a variable resistance element is coupled to the corresponding selecting element 220 by, e.g., being connected to the gate of a transistor as the selecting element 220. As shown in FIG. 2A, the voltage of the word line 230 may be enabled to turn on the transistor 220. As current flows from one end 251 to the other end 252 (in the direction indicated by the arrow), that is, from the first electrode layer 110 as a top electrode to the second electrode layer 120 as a bottom electrode in the MTJ element 100 shown in FIG. 1, the magnetization direction of the first ferromagnetic layer 112 functioning as a free ferromagnetic layer and the magnetization direction of the second ferromagnetic layer 122 functioning as a pinned ferromagnetic layer become parallel to each other. Under this condition, the variable resistance element 210 is in a low resistance state. When the variable resistance element 210 is in the low resistance state, it is defined that a 'low' data bit value "0" is stored in the variable resistance element 210.

FIG. 2B is a diagram explaining a principle of recording a high data bit value "1" in the variable resistance element 210. In a similar manner, the word line 230 connected to the variable resistance element 210 is activated to turn on the transistor 220. As current flows from the other end 252 to one end 251 (in the direction indicated by the arrow), that is, from the second electrode layer 120 to the first electrode layer 110 in the MTJ element 100 shown in FIG. 1, the magnetization direction of the first ferromagnetic layer 112 and the magnetization direction of the second ferromagnetic layer 122 become anti-parallel to each other. Under this condition, the variable resistance element 210 is in a high resistance state. When the variable resistance element 210 is in the high resistance state, it is defined that a 'high' data bit value "1" is stored in the variable resistance element 210.

Figure 3:
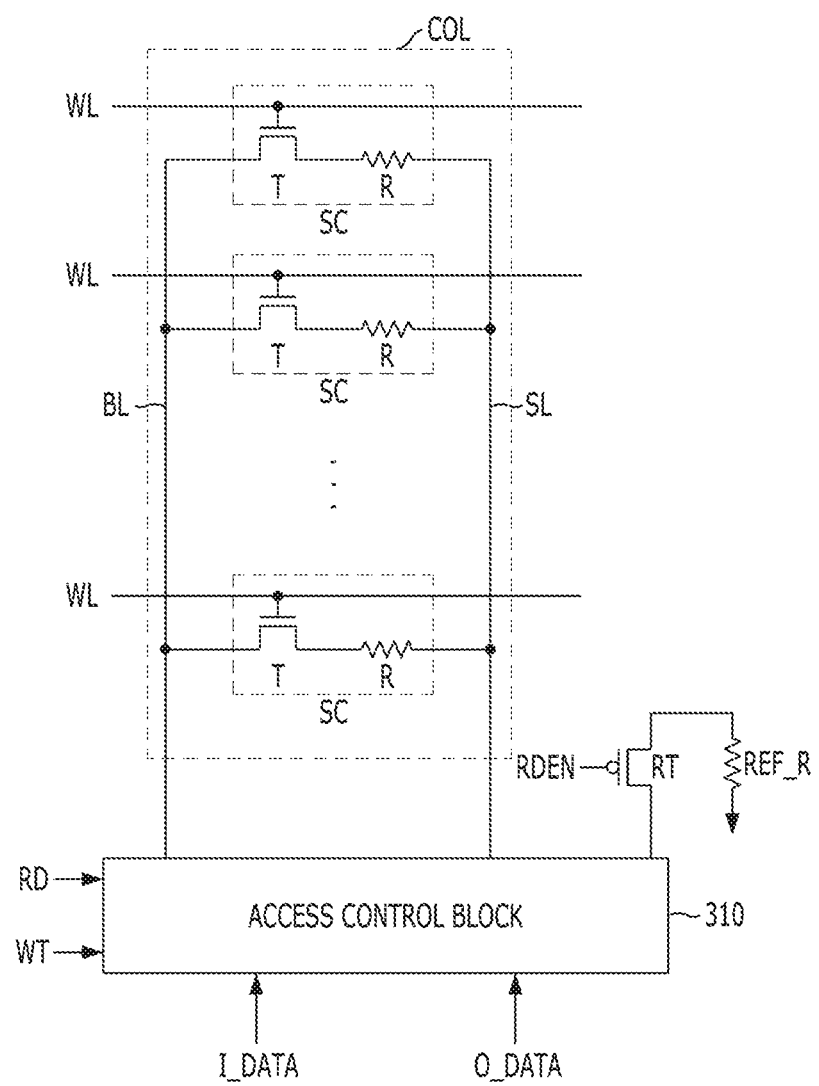
FIG. 3 is an exemplary configuration diagram of a memory circuit or device including variable resistance elements.

FIG. 3 is an exemplary configuration diagram of a memory circuit or device including variable resistance elements.

As shown in FIG. 3, a memory device may include a column COL, a reference resistance element REF_R, and an access control block 310. The column COL may include a plurality of storage cells SC.

The column COL may include a bit line BL, a source line SL, and the plurality of storage cells SC which are connected between the bit line BL and the source line SL. Each storage cell SC may include a variable resistance element R of which resistance value is changed in response to switching current flowing through both ends thereof, and a selection element T which is connected to one end of the variable resistance element R and is turned on when a corresponding word line WL is activated. The bit line BL and the source line SL may be connected to the access control block 310.

The variable resistance element R may have a first state in which it has a first resistance value and a second state in which it has a second resistance value higher than the first resistance value. The first state may correspond to the low resistance state described above, and the second state may correspond to the high resistance state described above. The first state of the variable resistance element R may be defined as a state in which a low data bit value "0" is stored, and the second state of the variable resistance element R may be defined as a state in which the high data bit value "1" is stored. Alternatively, the first state of the variable resistance element R may be defined as a state in which the high data bit value "1" is stored, and the second state of the variable resistance element R may be defined as a state in which the low data bit value "0" is stored.

The reference resistance element REF_R may have a resistance value between the first resistance value and the second resistance value of the variable resistance element R, and may be connected with the access control block 310 through a connection element RT (e.g., a transistor as shown) which is turned on or off in response to a read enable signal RDEN which is activated in a read operation.

The access control block 310 may flow a switching current in a direction determined by data I_DATA to be written in a selected storage cell SC, when a write command WT is activated. For example, the access control block 310 may cause the switching current to flow from the bit line BL to the source line SL through a selected storage cell SC, when the low data bit value "0" is written or stored, and may cause the switching current to flow from the source line SL to the bit line BL through a selected storage cell SC, when the high data bit value "1" is written or stored.

The access control block 310 may compare the resistance value of the variable resistance element R of a selected storage cell SC and the resistance value of the reference resistance element REF_R, read the data stored in the selected storage cell SC, and output data O_DATA, when a read command RD is activated. For example, if the low resistance state is a state in which the low data bit value "0" is stored and the high resistance state is a state in which the high data bit value "1" is stored, the access control block 310 may output the low data bit value "0" as the output data O_DATA when the resistance value of the variable resistance element R is smaller than the resistance value of the reference resistance element REF_R, and may output the high data bit value "1" as the output data O_DATA when the resistance value of the variable resistance element R is greater than the resistance value of the reference resistance element REF_R.

A read margin may be set to correspond to one half of the difference between the first resistance value and the second resistance value. As the read margin decreases, the number of errors may increase or read errors may be more likely to occur to cause degradation of the reliability and performance of the memory circuit or device. Furthermore, as the read margin decreases, a sufficient amount of time may be required for reading data in order to decrease the number of errors, and accordingly, a read speed may undesirably decrease.

Figure 4:
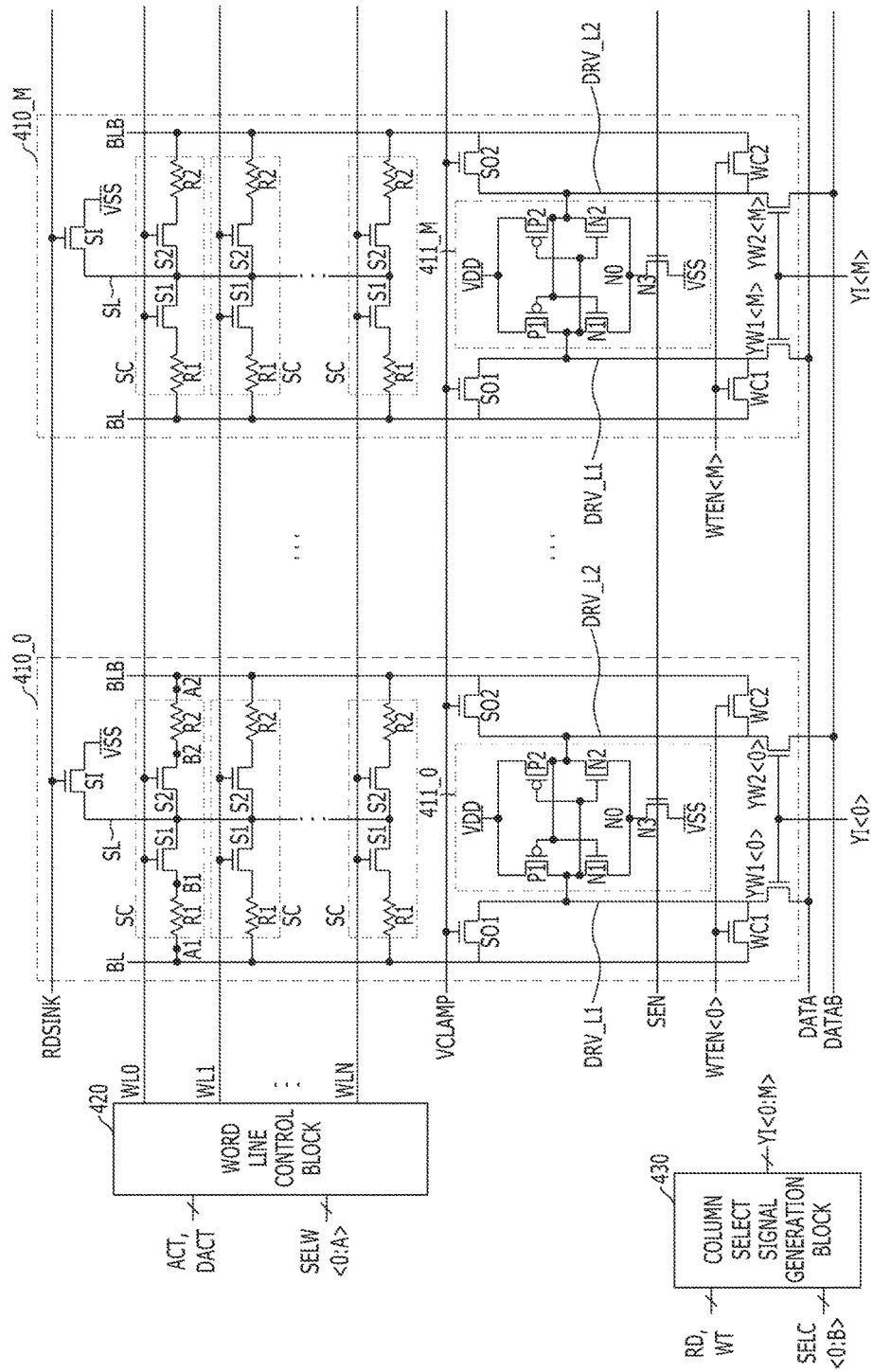
FIG. 4 is an exemplary configuration diagram of a memory circuit or device including storage cells each including two variable resistance elements.

FIG. 4 is an exemplary configuration diagram of a memory circuit or device including storage cells SC each including two variable resistance elements R1 and R2.

As shown in FIG. 4, a memory device may include one or more columns 410_0 to 410_M, a word line control block 420, a column select signal generation block 430, and a data line DATA and a data line bar DATAB.

The memory device will be described below with reference to FIG. 4.

Each of one or more columns 410_0 to 410_M may include a plurality of storage cells SC, a bit line BL and a bit line bar BLB, a source line SL, first and second driving lines DRV_L1 and DRV_L2, and a corresponding driving blocks 411_0 to 411_M. The columns 410_0 to 410_M may be arranged in various manners in relation to the corresponding driving blocks 411_0 to 411_M. For example, all storage cells SC of each column 410_0 to 410_M may be disposed on one side of the corresponding driving blocks 411_0 to 411_M. Alternatively, some of storage cells SC of each columns 410_0 to 410_M may be disposed on one side of each of the driving blocks 411_0 to 411_M and the remaining storage cells SC of each columns 410_0 to 410_M may be disposed on the other side of each of the driving blocks 411_0 to 411_M. FIG. 4 shows an exemplary configuration that all storage cells SC of each columns 410_0 to 410_M are disposed on one side (for example, the upper side) of the corresponding driving blocks 411_0 to 411_M.

The plurality of respective columns 410_0 to 410_M may include first column selection elements YW1<0:M> and second column selection elements YW2<0:M>. Each of the first column selection elements YW1<0:M> each of which is connected between the first driving line DRV_L1 and the data line DATA and is turned on when a corresponding column is selected. Each of the second column selection elements YW2<0:M> is connected between the second driving line DRV_L2 and the data line bar DATAB and is turned on when a corresponding column is selected. The first column selection elements YW1<0:M> and the second column selection elements YW2<0:M> may operate in response to column select signals YI<0:M>, and may be turned on when the corresponding column select signal are activated.

Each of the plurality of storage cells SC may store 1-bit data value, and may be selected when a corresponding word line among a plurality of word lines WL0 to WLN is activated. Each of the plurality of storage cells SC may include two variable resistance elements R1 and R2 and two selection elements S1 and S2. In each storage cell, the first variable resistance element R1 may have a first resistance value when a first value is stored in the storage cell SC, and may have a second resistance value when a second value is stored in the storage cell SC. The second variable resistance element R2 may have the second resistance value when the first value is stored in the storage cell SC, and may have the first resistance value when the second value is stored in the storage cell SC. The first value and the second value may correspond to the high data bit value and the low data bit value, respectively, or may correspond to low data bit value and the high data bit value, respectively. In the descriptions below, it is assumed that the first value and the second value correspond to the low data bit value and the high data bit value, respectively.

One end A1 of the first variable resistance element R1 may be connected to the bit line BL, and the other end B1 of the first variable resistance element R1 may be connected to the source line SL through the first selection element S1. One end A2 of the second variable resistance element R2 may be connected to the bit line bar BLB, and the other end B2 of the second variable resistance element R2 may be connected to the source line SL through the second selection element S2. The first and second selection elements S1 and S2 may be turned on or off in response to the voltage of a corresponding word line WL.

The first and second variable resistance elements R1 and R2 may be switched between the first resistance value and the second resistance value according to a direction of the switching current flowing therethrough. For example, the resistance values of the first and second variable resistance elements R1 and R2 may be switched to the first resistance value when the switching current flows along the direction from B1 to A1 and from B2 to A2, respectively. The resistance values of the first and second variable resistance elements R1 and R2 may be switched to the second resistance value when the switching current flows along the direction from A1 to B1 and A2 to B2, respectively The word line control block 420 may activate a word line based on word line selection information SELW<0:A>, among the plurality of word lines WL0 to WLN, in response to an activation signal ACT. The word line control block 420 may provide a voltage to activate a corresponding word line for turning on the selection elements S1 and S2. The word line control block 420 may deactivate an activated word line in response to a deactivation signal DACT.

The column select signal generation block 430 may activate a column select signal based on column selection information SELC<0:B>, among the plurality of column select signals YI<0:M>, for a predefined period in response to a read command RD or a write command WT.

During a write operation, if a corresponding column is selected, a driving block 411_0 to 411_M may latch the data on the data line DATA and the data line bar DATAB and drive the first driving line DRV_L1 and the second driving line DRV_L2. During a read operation, the driving block 411_0 to 411_M may drive the first driving line DRV_L1 and the second driving line DRV_L2 with voltages corresponding to current flowing through the bit line BL and the bit line bar BLB. Also, when deactivated, the driving block 411_0 to 411_M may precharge the first driving line DRV_L1 and the second driving line DRV_L2 with a predetermined voltage. For example, in FIG. 4, the first driving line DRV_L1 and the second driving line DRV_L2 are precharged with a power supply voltage VDD.

Each of the driving blocks 411_0 to 411_M may include a first PMOS transistor P1 which has one end connected to the first driving line DRV_L1 and the other end applied with the power supply voltage VDD and is turned on or off in response to the voltage of the second driving line DRV_L2, a second PMOS transistor P2 which has one end connected to the second driving line DRV_L2 and the other end applied with the power supply voltage VDD and is turned on or off in response to the voltage of the first driving line DRV_L1, a first NMOS transistor N1 which has one end connected to the first driving line DRV_L1 and the other end connected to an internal node NO and is turned on or off in response to the voltage of the second driving line DRV_L2, a second NMOS transistor N2 which has one end connected to the second driving line DRV_L2 and the other end connected to the internal node NO and is turned on or off in response to the voltage of the first driving line DRV_L1, and a third NMOS transistor N3 which has one end connected to the internal node NO and the other end applied with a ground voltage VSS and is turned on or off in response to an enable signal SEN activated during the activation period of each of the driving blocks 411_0 to 411_M and deactivated during the deactivation period of each of the driving blocks 411_0 to 411_M.

The first driving line DRV_L1 may be connected with the bit line BL through a first write connection element WC1 and a first sourcing connection element SO1, and the second driving line DRV_L2 may be connected with the bit line bar BLB through a second write connection element WC2 and a second sourcing connection element SO2. The source line SL may be connected with the terminal of the ground voltage VSS through a sinking connection element SI.

The first and second sourcing connection elements SO1 and SO2 may be turned on or off in response to a clamp signal VCLAMP which is activated for a predetermined period after a word line is activated. The sinking connection element SI may be turned on or off in response to a read sinking signal RDSINK which is activated for a preselected period after a word line is activated. The first and second write connection elements WC1 and WC2 may be turned on or off in response to each of write enable signals WTEN<0:M> which is activated for a preset period during the write operation when a corresponding column is selected.

Hereafter, the read and write operations of the memory device will be described with reference to FIGS. 5A and 5B.

Figure 5A:
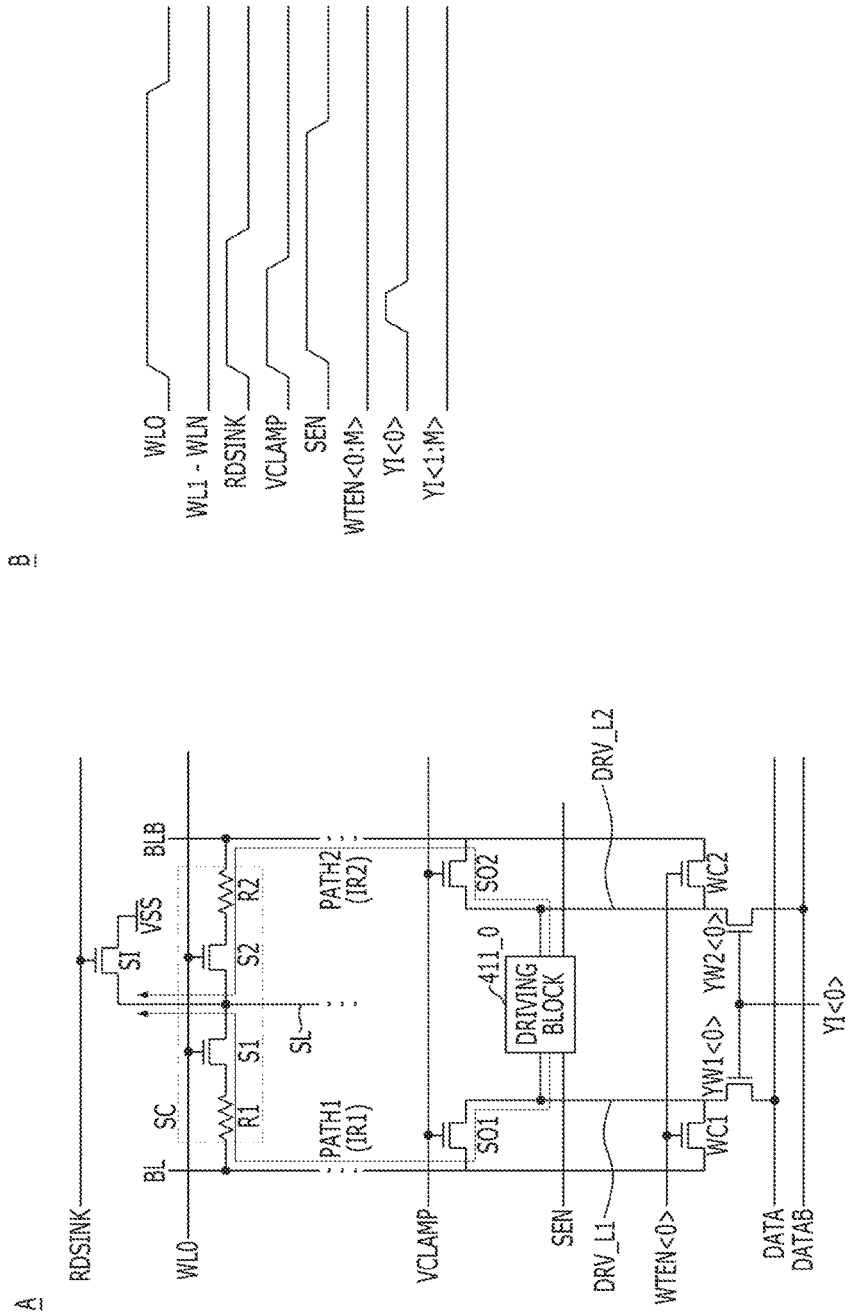
FIG. 5A is a diagram explaining an example of a read operation of the memory device shown in FIG. 4.

FIG. 5A is a diagram explaining the read operation of the memory device shown in FIG. 4.

With reference to FIG. 5A, descriptions will be made assuming that the first column 410_0 is selected and the data bit value of the storage cell SC connected to the first word line WL0 is to be read. For the sake of simplicity in illustration, in a configuration diagram A, the storage cell SC connected to the first word line WL0 of the first column 410_0 and necessary components for the read operation are mainly shown and other elements are omitted. A waveform diagram B illustrates the waveforms of the signals applied to respective component elements of the memory device in the read operation.

Since the enable signal SEN is in a deactivated state before the read operation is started, the driving block 411_0 may be in a deactivated state (the third NMOS transistor N3 is turned off), and the first and second driving lines DRV_L1 and DRV_L2 may be in a state in which they are precharged with the power supply voltage VDD.

If the activation signal ACT is activated, the word line WL0 corresponding to the word line selection information SELW<0:A> may be activated, and the first and second selection elements S1 and S2 corresponding to the word line WL0 may be turned on. Thereafter, as the clamp signal VCLAMP is activated for the predetermined period, the first and second sourcing connection elements SO1 and SO2 may be turned on. As the read sinking signal RDSINK is activated for the preselected period, the sinking connection element SI may be turned on. First read current IR1 may flow through a first path PATH1 due to the potential difference between the first driving line DRV_L1 and the source line SL, and second read current IR2 may flow through a second path PATH2 due to the potential difference between the second driving line DRV_L2 and the source line SL.

The magnitude of the first read current IR1 may be inversely proportional to the resistance value of the first variable resistance element R1, and the magnitude of the second read current IR2 may be inversely proportional to the resistance value of the second variable resistance element R2. Since the resistance value of the first variable resistance element R1 and the resistance value of the second variable resistance element R2 are different, a difference between the magnitudes of the first read current IR1 and the second read current IR2 causes the voltage levels of the first driving line DRV_L1 and the second driving line DRV_L2 to be different from each other. If the enable signal SEN is activated, the third NMOS transistor N3 may be turned on, and the driving block 411_0 may be activated. The activated driving block 411_0 may drive the first driving line DRV_L1 and the second driving line DRV_L2 according to the voltage difference between the first driving line DRV_L1 and the second driving line DRV_L2, and may latch the data stored in the storage cell SC.

If the first and second variable resistance elements R1 and R2 respectively have the first resistance value and the second resistance value, because the first read current IR1 is greater than the second read current IR2, the voltage of the first driving line DRV_L1 becomes lower than the voltage of the second driving line DRV_L2. The activated driving block 411_0 may drive the first driving line DRV_L1 to the ground voltage VSS and the second driving line DRV_L2 to the power supply voltage VDD, and may latch the value (the first value) stored in the selected storage cell SC. If the first and second variable resistance elements R1 and R2 respectively have the second resistance value and the first resistance value, the first and second driving lines DRV_L1 and DRV_L2 may be driven in an opposite way to the above description, and the driving block 411_0 may latch the second value.

If the read command RD is activated, after the data of the selected storage cell SC is latched by the driving block 411_0, the first column select signal YI<0> corresponding to the column selection information SELC<0:B> may be activated. The first and second column selection elements YW1<0> and YW2<0> of the first column 410_0 may be turned on in response to the first column select signal YI<0>, and the data latched by the driving block 411_0 may be outputted to the data line DATA and the data line bar DATAB.

For reference, in the read operation, if the magnitudes of the read current IR1 and IR2 are too large, the resistance values of the variable resistance elements R1 and R2 may be switched. Accordingly, the magnitudes of the read current IR1 and IR2 should be limited to certain magnitudes such that the resistance values of the variable resistance elements R1 and R2 are not switched, and the activation level of the clamp signal VCLAMP may be set to a predetermined level. The magnitudes of the read current IR1 and IR2 may be decreased by lowering the activation level of the clamp signal VCLAMP. Conversely, the magnitudes of the read current IR1 and IR2 may be increased by raising the activation level of the clamp signal VCLAMP.

FIG. 5B is a diagram explaining the write operation of the memory device shown in FIG. 4.

With reference to FIG. 5B, descriptions will be made assuming that the first column 410_0 is selected and the data of the storage cell SC connected to the first word line WL0 is to be written. For the sake of simplicity in illustration, in configuration diagrams A1 and A2, the storage cell SC connected to the first word line WL0 of the first column 410_0 and the necessary component elements for the writing operation are mainly shown and other component elements are omitted. A waveform diagram B illustrates the waveforms of the signals applied to respective component elements of the memory device during the write operation.

Since the enable signal SEN is in a deactivated state before the write operation is started, the driving block 411_0 may be in a deactivated state (the third NMOS transistor N3 is turned off), and the first and second driving lines DRV_L1 and DRV_L2 may be in a state in which they are precharged with the power supply voltage VDD.

If the activation signal ACT is activated, the word line WL0 may be activated based on the word line selection information SELW<0:A>, and the first and second selection elements S1 and S2 that are coupled to the word line WL0 may be turned on. If the enable signal SEN is activated, the third NMOS transistor N3 may be turned on, and the driving block 411_0 may be activated.

If the write command WT is activated, the driving block 411_0 is activated and then, the first column select signal YI<0> corresponding to the column selection information SELC<0:B> may be activated. The first and second column selection elements YW1<0> and YW2<0> of the first column 410_0 may be turned on in response to the first column select signal YI<0>, and the data of the data line and the data line bar DATA and DATAB may be transferred to the first and second driving lines DRV_L1 and DRV_L2 and be latched by the driving block 411_0.

After the driving block 411_0 latches the data of the data line DATA and the data line bar DATAB, if the write enable signal WTEN<0> is activated, the first and second write connection elements WC1 and WC2 may be turned on, and write current IW may flow through the first and second variable resistance elements R1 and R2. A direction in which the write current IW flows may be changed according to the value of the data transferred through the data line DATA and the data line bar DATAB.

The following explains an example for how the low data bit value "0" (the first value) is written (Case A1).

The driving block 411_0 may drive the first driving line DRV_L1 to the ground voltage VSS and the second driving line DRV_L2 to the power supply voltage VDD. If the write enable signal WTEN<0> is activated, the first driving line DRV_L1 and the bit line BL may be connected, and the second driving line DRV_L2 and the bit line bar BLB may be connected. Therefore, the write current IW may flow from the first driving line DRV_L1 to the second driving line DRV_L2. Accordingly, the resistance values of the first and second variable resistance elements R1 and R2 may be switched to the first resistance value and the second resistance value, respectively.

The following explains an example for how the high data bit value "1" (the second value) is written (Case A2).

The driving block 411_0 may drive the first driving line DRV_L1 to the power supply voltage VDD and the second driving line DRV_L2 to the ground voltage VS S. If the write enable signal WTEN<0> is activated, the first driving line DRV_L1 and the bit line BL may be connected, and the second driving line DRV_L2 and the bit line bar BLB may be connected. Therefore, the write current IW may flow from the second driving line DRV_L2 to the first driving line DRV_L1. Accordingly, the resistance values of the first and second variable resistance elements R1 and R2 may be switched to the second resistance value and the first resistance value, respectively.

Figure 6:
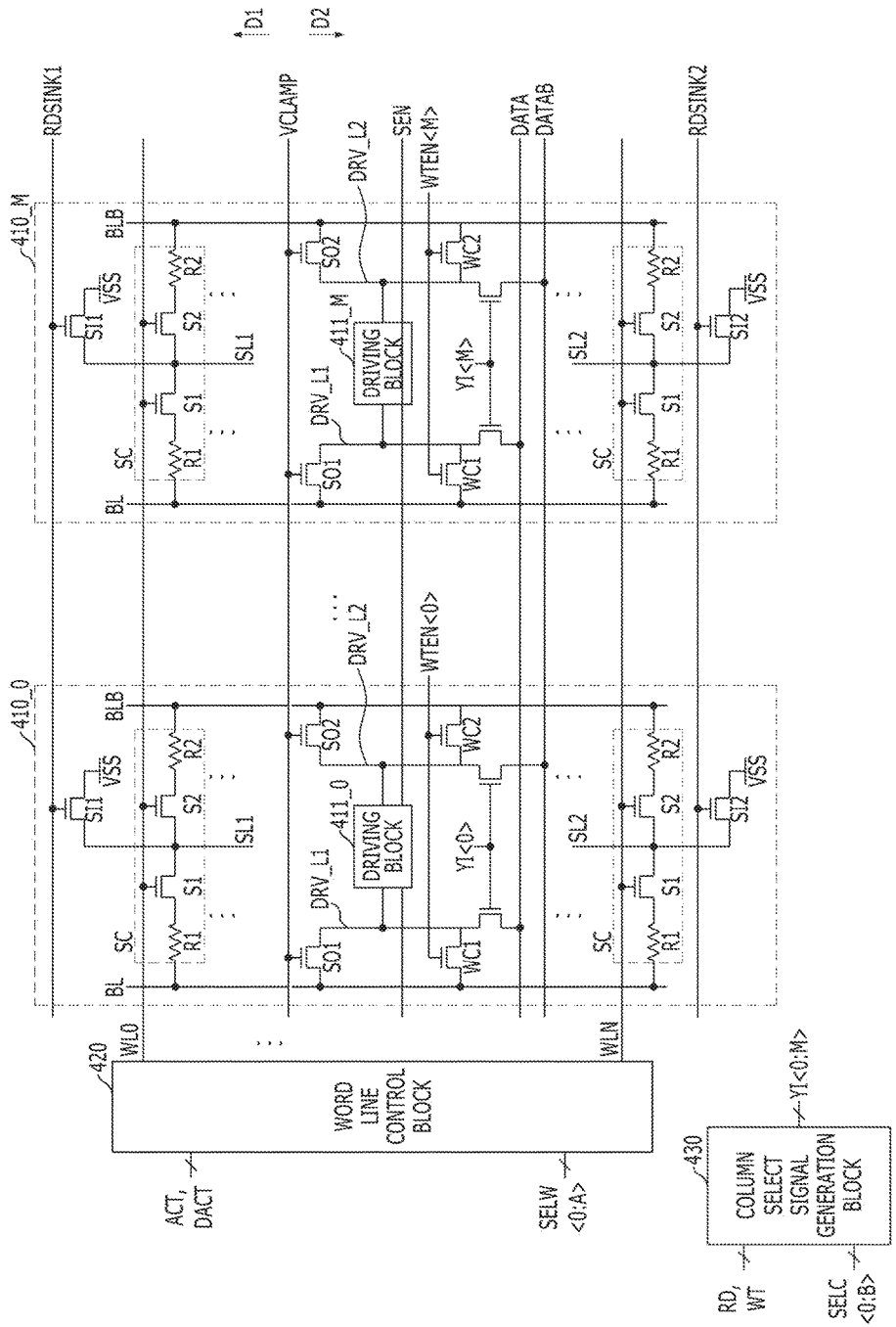
FIG. 6 is an exemplary configuration diagram of a memory circuit or a device including storage cells each including two variable resistance elements.

FIG. 6 is an exemplary configuration diagram of a memory circuit or device including storage cells SC each including two variable resistance elements R1 and R2.

As shown in FIG. 6, a memory device may include one or more columns 410_0 to 410_M, a word line control block 420, a column select signal generation block 430, and a data line DATA and a data line bar DATAB.

The memory device will be described below with reference to FIG. 6.

FIG. 6 shows that, in each of the columns 410_0 to 410_M, partial storage cells SC are disposed on one side D1 of each of the driving blocks 411_0 to 411_M and the remaining storage cells SC are disposed on the other side D2 of each of the driving blocks 411_0 to 411_M. In FIG. 6, the storage cells SC disposed on the one side D1 may be connected to a first source line SL1, and the storage cells SC disposed on the other side D2 may be connected to a second source line SL2.

The first source line SL1 may be connected with the terminal of a ground voltage VSS through a first sinking connection element SI1, and the second source line SL2 may be connected with the terminal of the ground voltage VSS through a second sinking connection element SI2. The first sinking connection element SI1 may be turned on or off in response to a first read sinking signal RDSINK1 which is activated for a preselected period after a word line is activated, and the second sinking connection element SI2 may be turned on or off in response to a second read sinking signal RDSINK2 which is activated for the preselected period after a word line is activated.

In the memory device of FIG. 6, in a read operation, the first read sinking signal RDSINK1 may be activated in the case where the storage cell SC disposed on the one side D1 of each of the driving blocks 411_0 to 411_M is selected, and the second read sinking signal RDSINK2 may be activated in the case where the storage cell SC disposed on the other side D2 of each of the driving blocks 411_0 to 411_M is selected. Except this, the operation of the memory device shown in FIG. 6 may be the same as the operation of the memory device shown in FIG. 4 described above with reference to FIGS. 4 and 5.

Figure 7:
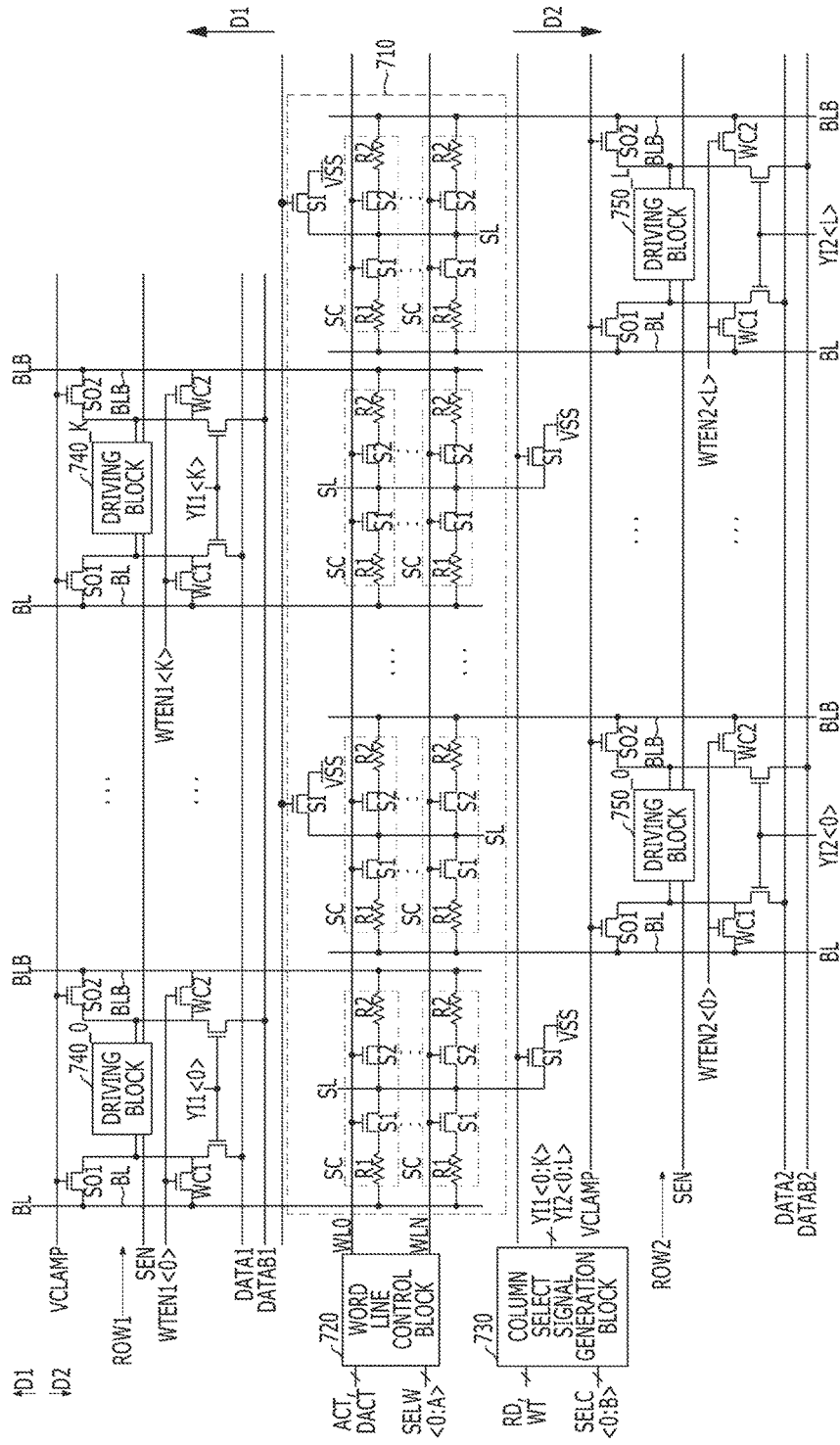
FIG. 7 is an exemplary configuration diagram of a memory circuit or a device including storage cells each including two variable resistance elements.

FIG. 7 is an exemplary configuration diagram of a memory circuit or device including storage cells SC each including two variable resistance elements R1 and R2.

As shown in FIG. 7, a memory device may include a cell array 710, a word line control block 720, a column select signal generation block 730, one or more first driving blocks 740_0 to 740_K, one or more second driving blocks 750_0 to 750_L, a first data line DATA1 and a first data line bar DATAB1, and a second data line DATA2 and a second data line bar DATAB2.

The memory device will be described below with reference to FIG. 7.

The memory devices shown in FIGS. 4 and 6 include cell arrays including the respective driving blocks disposed in one row. For example, FIG. 4 illustrates cell arrays that are arranged on the same side of the driving blocks 411_0 to 411_M which are disposed in one row, and FIG. 6 shows cell arrays that are arranged on different sides of the driving blocks 411_0 to 411_M which are disposed in one row.

In the memory device shown in FIG. 7, driving blocks may be disposed in different rows. For example, a cell array 710 includes storage cells SC that are connected to first driving blocks 740_0 to 740_k and storage cells SC that are connected to the second driving blocks 750_0 to 750_L. One or more first driving blocks 740_0 to 740_K may be disposed in a first row ROW1, and one or more second driving blocks 750_0 to 750_L may be disposed in a second row ROW2.

The first driving blocks 740_0 to 740_K may be connected with the first data line DATA1 and the first data line bar DATAB1 through corresponding first and second column selection elements YW1 and YW2, and the second driving blocks 750_0 to 750_L may be connected with the second data line DATA2 and the second data line bar DATAB2 through corresponding first and second column selection elements YW1 and YW2. The respective first and second column selection elements YW1 and YW2 may be turned on when a corresponding column select signal among pluralities of column select signals YI1<0:K> and YI2<0:L> is activated.

In the case where a selected storage cell SC corresponds to the first driving blocks 740_0 to 740_K, the first data line and the first data line bar DATA1 and DATAB1 may transfer the data read from the selected storage cell SC or may transfer data to write in the selected storage cell SC. In the case where a selected storage cell SC corresponds to the second driving blocks 750_0 to 750_L, the second data line DATA2 and the second data line bar DATAB2 may transfer the data read from the selected storage cell SC or may transfer data to write in the selected storage cell SC.

The cell array 710 may include storage cells SC which are connected with the first driving blocks 740_0 to 740_K and storage cells SC which are connected with the second driving blocks 750_0 to 750_L. The storage cells SC connected with the first driving blocks 740_0 to 740_K are disposed on one sides D2 of the first driving blocks 740_0 to 740_K. The storage cells SC connected with the second driving blocks 750_0 to 750_L are disposed on the one sides D1 of the second driving blocks 750_0 to 750_L. The respective storage cells SC may be connected between bit lines and bit line bars BL and BLB. The driving blocks 740_0 to 740_K and 750_0 to 750_L may be connected with first data lines DATA1 or second data lines DATA2 through corresponding bit lines BL, and may be connected with first data line bars DATAB1 or second data line bars DATAB2 through corresponding bit line bars BLB. The configurations of the respective driving blocks 740_0 to 740_K and 750_0 to 750_L and the read and write operations of the storage cells SC connected to the respective driving blocks 740_0 to 740_K and 750_0 to 750_L are the same as those described above with reference to FIG. 6.

As shown in FIGS. 4 to 7, the cell array of the memory device and its peripheral circuits may be configured in various ways.

FIGS. 4, 6 and 7 show that, in each storage cell SC, one end of the first variable resistance element R1 is connected to the bit line BL, the first selection element S1 is connected between the other end of the first variable resistance element R1 and the source line SL, SL1 or SL2, one end of the second variable resistance element R2 is connected to the bit line bar BLB, and the second selection element S2 is connected between the other end of the second variable resistance element R2 and the source line SL, SL1 or SL2. The positions of the first variable resistance element R1 and the first selection element S1 and the connection configurations such as connection order of the second variable resistance element R2 and the second selection element S2 may be changed according to a design. For example, it may be envisaged that the first selection element S1 is connected to the bit line BL, the first variable resistance element R1 is connected between the first selection element S1 and the source line SL, SL1 or SL2, the second variable resistance element R2 is connected to the bit line bar BLB, and the second selection element S2 is connected between the second variable resistance element R2 and the source line SL, SL1 or SL2. Alternatively, it may be envisaged that the first variable resistance element R1 is connected to the bit line BL, the first selection element S1 is connected between the first variable resistance element R1 and the source line SL, SL1 or SL2, the second selection element S2 is connected to the bit line bar BLB, and the second variable resistance element R2 is connected between the second selection element S2 and the source line SL, SL1 or SL2. Finally, it may be envisaged that the first selection element S1 is connected to the bit line BL, the first variable resistance element R1 is connected between the first selection element S1 and the source line SL, SL1 or SL2, the second selection element S2 is connected to the bit line bar BLB, and the second variable resistance element R2 is connected between the second selection element S2 and the source line SL, SL1 or SL2. Also, the connection orders of the variable resistance elements R1 and R2 and the selection elements S1 and S2 may be varied in the respective storage cells SC.

Figure 8:
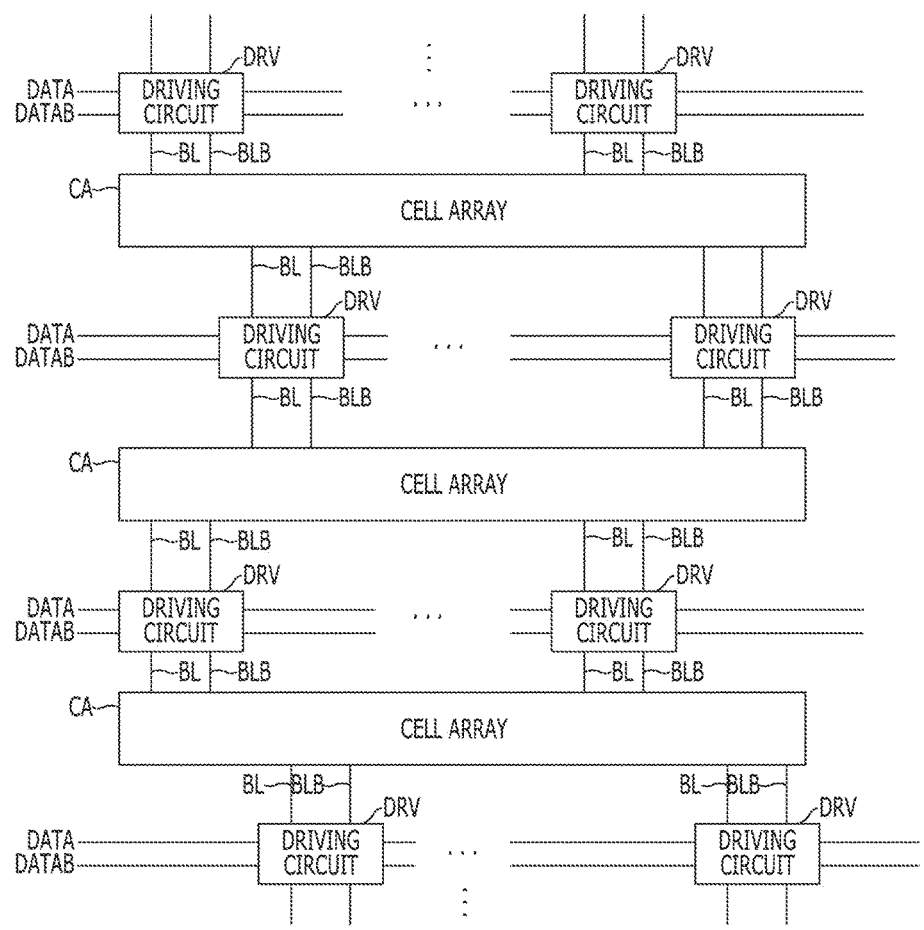
FIG. 8 is a diagram illustrating a configuration in which a plurality of cell arrays and a plurality of driving circuits are disposed to have the same structure as the memory device of FIG. 7.

FIG. 8 is a diagram illustrating a configuration in which a plurality of cell arrays CA and a plurality of driving circuits DRV are disposed in the same manner as the memory device of FIG. 7.

In FIG. 8, the cell arrays CA and the driving circuits DRV are simply illustrated by blocks, to show a pattern in which the plurality of cell arrays CA and the plurality of driving circuits DRV are disposed. Moreover, since FIG. 8 is provided for showing the connection relationship between the cell arrays CA and the driving circuits DRV, component elements such as the word lines WL, the word line control block 720, the column select signal generation block 730 and the column selection elements YW1 and YW2 are omitted. For reference, each driving circuit DRV may include a driving block and first and second driving lines as described above.

As shown in FIG. 8, the driving circuits DRV may be connected with corresponding storage cells (not shown) through bit lines and bit line bars BL and BLB, and may be connected with corresponding data lines DATA and data line bars DATAB.

For example, each of the respective driving circuits DRV may be connected with the storage cells of an adjacent cell array CA, through a bit line BL and a bit line bar BLB. When a corresponding driving circuit DRV is selected, a bit line BL and a bit line bar BLB may be connected with a data line DATA and a data line bar DATAB. The storage cells included in one cell array CA may be connected with a driving circuit DRV which is disposed on one side D1 or the other side D2 of the corresponding cell array CA.

As is apparent from the above descriptions, in the electronic device according to the implementations, since a storage cell includes two variable resistance elements and thus a difference in the resistance values of the storage cell according to the data stored therein increases, the margins and speeds of read and write operations of the electronic device may be increased.

Further, in the electronic device according to the implementations, since the degree of integration of storage cells each including two variable resistance elements is increased, the size of the electronic device may be decreased.

Figure 9:
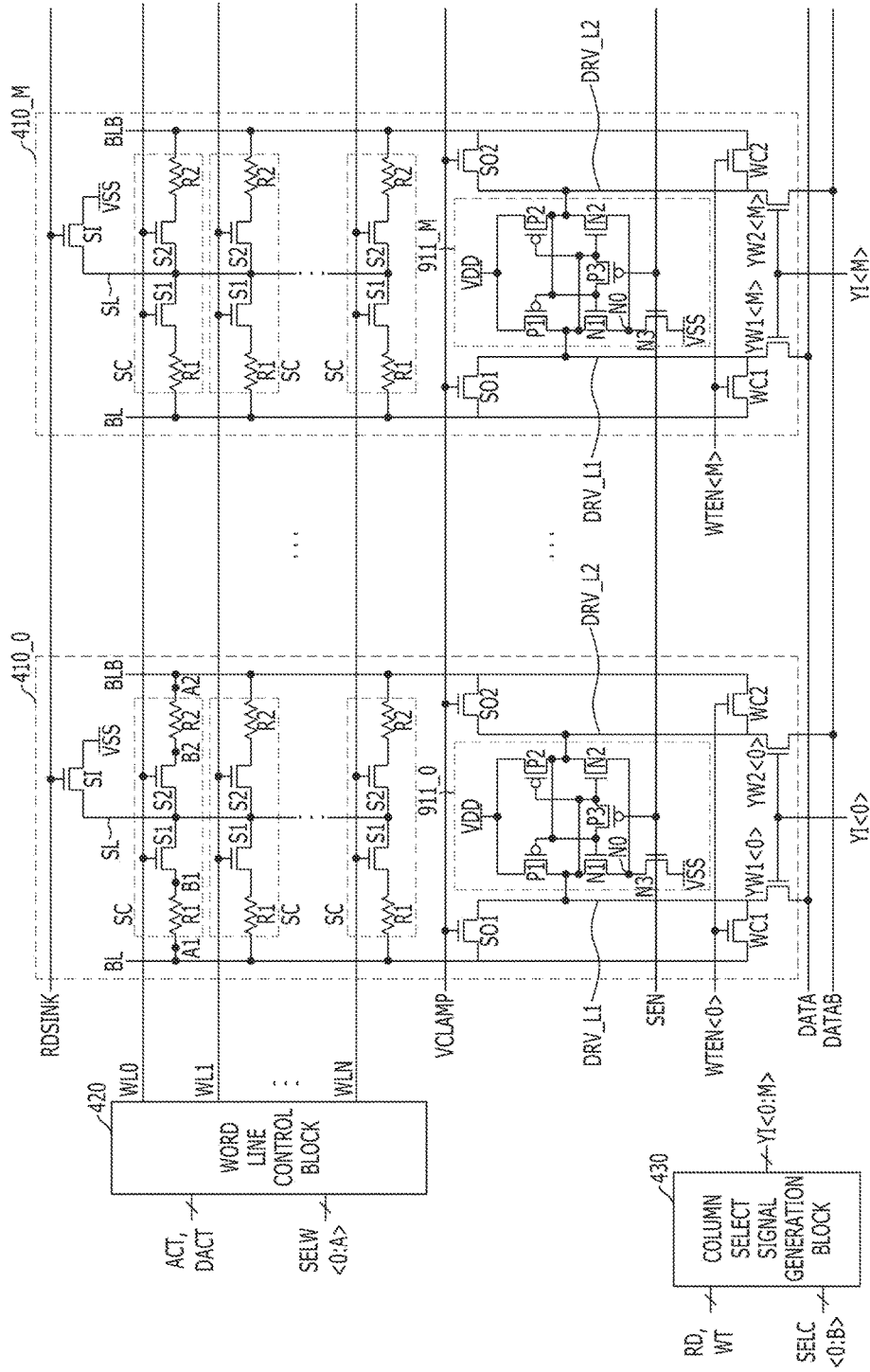
FIG. 9 is an exemplary configuration diagram of a memory circuit or device including storage cells SC each including two variable resistance elements R1 and R2.

FIG. 9 is an exemplary configuration diagram of a memory circuit or device including storage cells SC each including two variable resistance elements R1 and R2. The memory circuit or device of FIG. 9 may include driving units 911_0-911_M which are different from the memory circuit or device of FIG. 4.

During a write operation, if a corresponding column is selected, a driving block 911_0 to 911_M may latch the data on the data line DATA and the data line bar DATAB and drive the first driving line DRV_L1 and the second driving line DRV_L2. During a read operation, the driving block 911_0 to 911_M may drive the first driving line DRV_L1 and the second driving line DRV_L2 with voltages corresponding to current flowing through the bit line BL and the bit line bar BLB. Also, when deactivated, the driving block 911_0 to 911_M may precharge the first driving line DRV_L1 and the second driving line DRV_L2 with a predetermined voltage. For example, in FIG. 4, the first driving line DRV_L1 and the second driving line DRV_L2 are precharged with a power supply voltage VDD. During a precharge period, the driving block 911_0 to 911_M may drive both ends with same voltage level. The precharge period is a period where the enable signal SEN is deactivated.

Each of the driving blocks 911_0 to 911_M may further include a third PMOS transistor P3 having one end which is connected to the first driving line DRV_L1 and the other end which is connected to the second driving line DRV_L2, and configured to be turned on and off in response to the enable signal SEN. The third PMOS transistor P3 turns off when the enable signal SEN is activated, and turns on when the enable signal SEN is deactivated. When the third transistor turns on, the both ends of the driving unit electrically connected. Therefore, voltage levels of the both ends of the driving unit become equal, and the first and second driving line DRV_L1, DRV_L2 are driven with same voltage level.

The driving units of FIG. 6 and FIG. 7 may include components which are same components of driving unit of FIG. 9.

The above and other memory circuits or semiconductor devices based on the disclosed technology can be used in a range of devices or systems. FIGS. 10-14 provide some examples of devices or systems that can implement the memory circuits disclosed herein.

Figure 10:
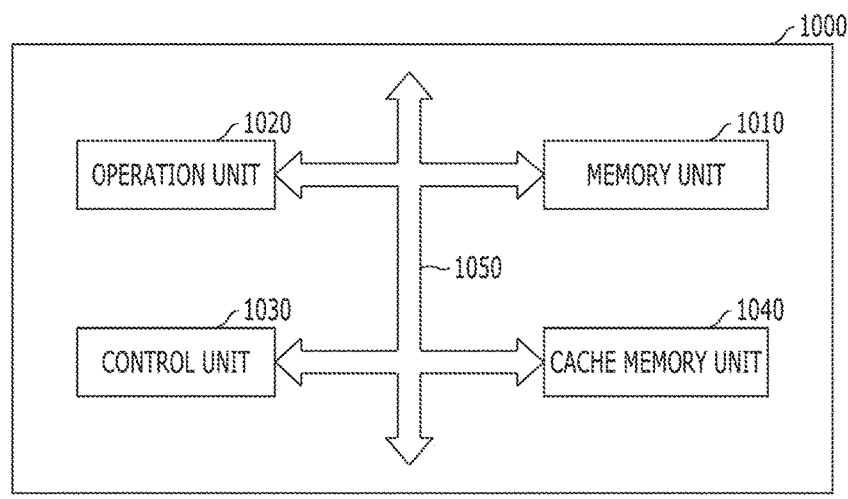
FIG. 10 shows an example of a configuration diagram of a microprocessor implementing memory circuitry based on the disclosed technology.

FIG. 10 shows an example of a configuration diagram of a microprocessor based on another implementation of the disclosed technology.

Referring to FIG. 10, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and an address where data for performing of the operations are stored.

The memory unit 1010 may include one or more of the above-described semiconductor devices in accordance with the implementations. For example, the memory unit 1010 may include: one or more columns; and a data line and a data line bar connected with a column selected among the one or more columns. Each of the one or more columns may include a plurality of storage cells each configured to store 1-bit data, each storage cell including a first variable resistance element which has a first resistance value when a first value is stored therein and a second resistance value when a second value is stored therein and a second variable resistance element which has the second resistance value when the first value is stored therein and the first resistance value when the second value is stored therein; a bit line connected to one end of the first variable resistance element; a bit line bar connected to one end of the second variable resistance element; a source line connected to the other ends of the first and second variable resistance elements; and a driving block configured to latch data of the data line and the data line bar when a corresponding column is selected, the driving block configured to, in a write operation, drive the bit line and the bit line bar with a first voltage and a second voltage based on a value of the latched data, and the driving block further configured to, in a read operation, latch data corresponding to a current flowing through the bit line and the bit line bar. Through this, a read margin of the memory unit 1010 may be improved, speed of read and write operation of the memory unit may be increased and current and power consumption of the memory unit 1010 may be decreased. Consequently, operation speed and stability of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands and controlling input and output of signals of the microprocessor, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 11:
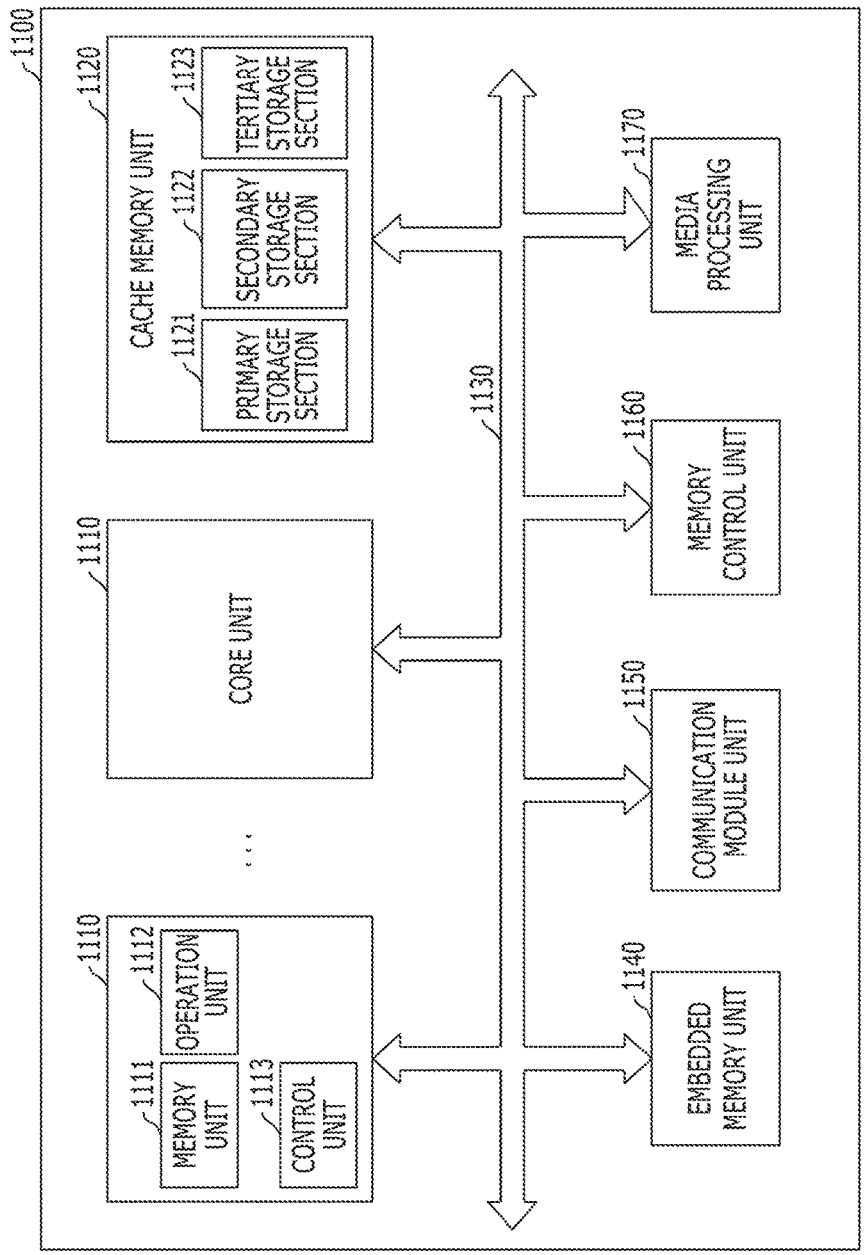
FIG. 11 shows an example of a configuration diagram of a processor implementing memory circuitry based on the disclosed technology.

FIG. 11 is a configuration diagram of a processor based on another implementation of the disclosed technology.

Referring to FIG. 11, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and an address where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage unit 1121, a secondary storage unit 1122 and a tertiary storage unit 1123. In general, the cache memory unit 1120 includes the primary and secondary storage units 1121 and 1122, and may include the tertiary storage unit 1123 in the case where high storage capacity is required. As the occasion demands, the cache memory unit 1120 may include an increased number of storage units. That is to say, the number of storage units which are included in the cache memory unit 1120 may be changed according to a design. The speeds at which the primary, secondary and tertiary storage units 1121, 1122 and 1123 store and discriminate data may be the same or different. In the case where the speeds of the respective storage units 1121, 1122 and 1123 are different, the speed of the primary storage unit 1121 may be largest. At least one storage unit of the primary storage unit 1121, the secondary storage unit 1122 and the tertiary storage unit 1123 of the cache memory unit 1120 may include one or more of the above-described semiconductor devices in accordance with the implementations. For example, the cache memory unit 1120 may include: one or more columns; and a data line and a data line bar connected with a column selected among the one or more columns. Each of the one or more columns may include a plurality of storage cells each configured to store 1-bit data, each storage cell including a first variable resistance element which has a first resistance value when a first value is stored therein and a second resistance value when a second value is stored therein and a second variable resistance element which has the second resistance value when the first value is stored therein and the first resistance value when the second value is stored therein; a bit line connected to one end of the first variable resistance element; a bit line bar connected to one end of the second variable resistance element; a source line connected to the other ends of the first and second variable resistance elements; and a driving block configured to latch data of the data line and the data line bar when a corresponding column is selected, the driving block configured to, in a write operation, drive the bit line and the bit line bar with a first voltage and a second voltage based on a value of the latched data, and the driving block further configured to, in a read operation, latch data corresponding to a current flowing through the bit line and the bit line bar. Through this, a read margin of the cache memory unit 1120 may be improved, speed of read and write operation of the memory unit may be increased, and current and power consumption of the cache memory unit 1120 may be decreased. Consequently, operation speed and stability of the processor 1100 may be improved.

Although it was shown in FIG. 11 that all the primary, secondary and tertiary storage units 1121, 1122 and 1123 are configured inside the cache memory unit 1120, it is to be noted that all the primary, secondary and tertiary storage units 1121, 1122 and 1123 of the cache memory unit 1120 may be configured outside the core unit 1110 and may compensate for a difference in data processing speed between the core unit 1110 and the external device. Meanwhile, it is to be noted that the primary storage unit 1121 of the cache memory unit 1120 may be disposed inside the core unit 1110 and the secondary storage unit 1122 and the tertiary storage unit 1123 may be configured outside the core unit 1110 to strengthen the function of compensating for a difference in data processing speed. In another implementation, the primary and secondary storage units 1121, 1122 may be disposed inside the core units 1110 and tertiary storage units 1123 may be disposed outside core units 1110. The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage unit 1121 of the cache memory unit 1120 may be configured in each core unit 1110 in correspondence to the number of the plurality of core units 1110, and the secondary storage unit 1122 and the tertiary storage unit 1123 may be configured outside the plurality of core units 1110 in such a way as to be shared through the bus interface 1130. The processing speed of the primary storage unit 1121 may be larger than the processing speeds of the secondary and tertiary storage unit 1122 and 1123. In another implementation, the primary storage unit 1121 and the secondary storage unit 1122 may be configured in each core unit 1110 in correspondence to the number of the plurality of core units 1110, and the tertiary storage unit 1123 may be configured outside the plurality of core units 1110 in such a way as to be shared through the bus interface 1130. The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data prepared in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory) and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 12:
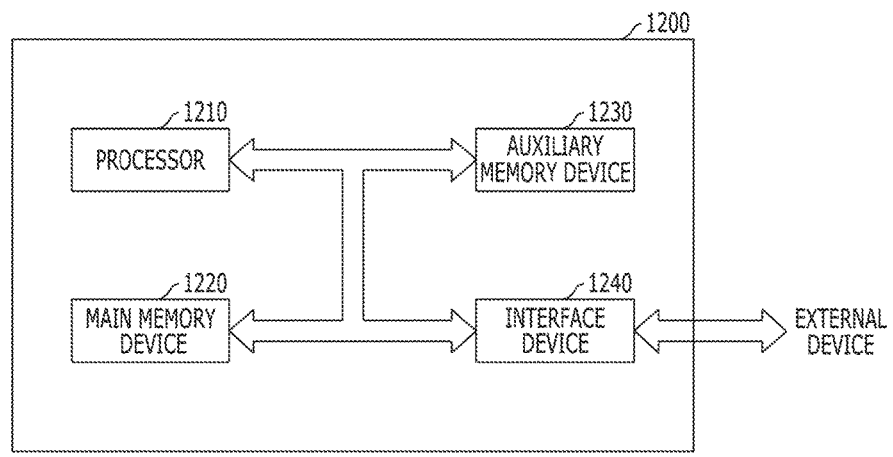
FIG. 12 shows an example of a configuration diagram of a system implementing memory circuitry based on the disclosed technology.

FIG. 12 is a configuration diagram of a system based on another implementation of the disclosed technology.

Referring to FIG. 12, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 decodes inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include: one or more columns; and a data line and a data line bar connected with a column selected among the one or more columns. Each of the one or more columns may include a plurality of storage cells each configured to store 1-bit data, each storage cell including a first variable resistance element which has a first resistance value when a first value is stored therein and a second resistance value when a second value is stored therein and a second variable resistance element which has the second resistance value when the first value is stored therein and the first resistance value when the second value is stored therein; a bit line connected to one end of the first variable resistance element; a bit line bar connected to one end of the second variable resistance element; a source line connected to the other ends of the first and second variable resistance elements; and a driving block configured to latch data of the data line and the data line bar when a corresponding column is selected, the driving block configured to, in a write operation, drive the bit line and the bit line bar with a first voltage and a second voltage based on a value of the latched data, and the driving block further configured to, in a read operation, latch data corresponding to a current flowing through the bit line and the bit line bar. Through this, a read margin of the main memory device 1220 may be improved, speed of read and write operation of the memory unit may be increased, and current and power consumption of the main memory device 1220 may be decreased. Consequently, operation speed and stability of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include: one or more columns; and a data line and a data line bar connected with a column selected among the one or more columns. Each of the one or more columns may include a plurality of storage cells each configured to store 1-bit data, each storage cell including a first variable resistance element which has a first resistance value when a first value is stored therein and a second resistance value when a second value is stored therein and a second variable resistance element which has the second resistance value when the first value is stored therein and the first resistance value when the second value is stored therein; a bit line connected to one end of the first variable resistance element; a bit line bar connected to one end of the second variable resistance element; a source line connected to the other ends of the first and second variable resistance elements; and a driving block configured to latch data of the data line and the data line bar when a corresponding column is selected, the driving block configured to, in a write operation, drive the bit line and the bit line bar with a first voltage and a second voltage based on a value of the latched data, and the driving block further configured to, in a read operation, latch data corresponding to a current flowing through the bit line and the bit line bar. Through this, a read margin of the auxiliary memory device 1230 may be improved, speed of read and write operation of the memory unit may be increased, and current and power consumption of the auxiliary memory device 1230 may be decreased. Consequently, operation speed and stability of the system 1200 may be improved.

Also, the auxiliary memory device 1230 may further include a data storage system (see the reference numeral 1300 of FIG. 13) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 13) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device and so on. The communication device may include a module capable of being connected with a wired network, a module capable of being connected with a wireless network and both of them.

The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 13:
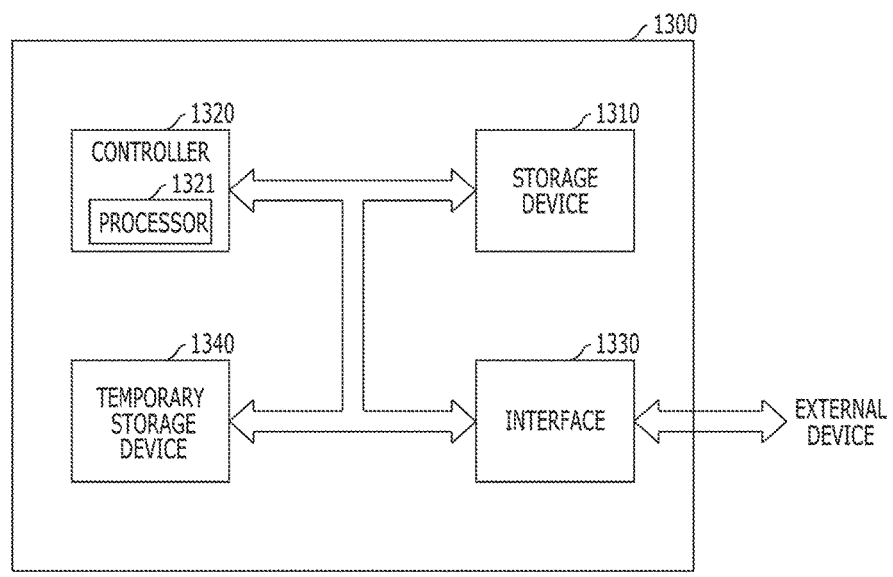
FIG. 13 shows an example of a configuration diagram of a data storage system implementing memory circuitry based on the disclosed technology.

FIG. 13 is a configuration diagram of a data storage system based on another implementation of the disclosed technology.

Referring to FIG. 13, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices.

In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other. The temporary storage device 1340 can store data temporarily implementation for efficiently transferring data between the interface 1330 and the storage device 1310 according to diversifications and high performance of an interface with an external device, a controller and a system. For example, the temporary storage device 1340 may include: one or more columns; and a data line and a data line bar connected with a column selected among the one or more columns. Each of the one or more columns may include a plurality of storage cells each configured to store 1-bit data, each storage cell including a first variable resistance element which has a first resistance value when a first value is stored therein and a second resistance value when a second value is stored therein and a second variable resistance element which has the second resistance value when the first value is stored therein and the first resistance value when the second value is stored therein; a bit line connected to one end of the first variable resistance element; a bit line bar connected to one end of the second variable resistance element; a source line connected to the other ends of the first and second variable resistance elements; and a driving block configured to latch data of the data line and the data line bar when a corresponding column is selected, the driving block configured to, in a write operation, drive the bit line and the bit line bar with a first voltage and a second voltage based on a value of the latched data, and the driving block further configured to, in a read operation, latch data corresponding to a current flowing through the bit line and the bit line bar. Through this, a read margin of the temporary storage device 1340 may be improved, speed of read and write operation of the memory unit may be increased, and current and power consumption of the temporary storage device 1340 may be decreased. Consequently, operation speed and stability of the data storage system 1300 may be improved.

Figure 14:
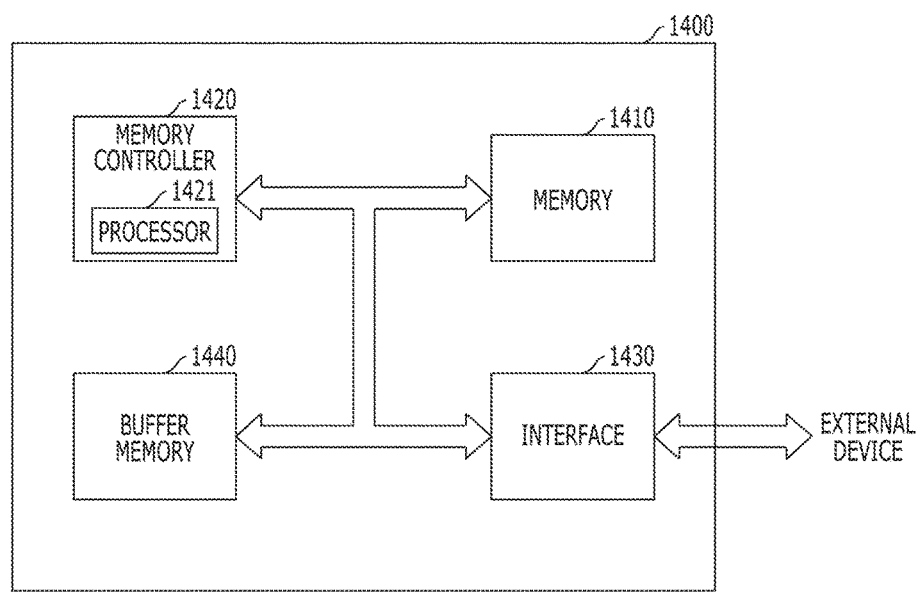
FIG. 14 shows an example of a configuration diagram of a memory system implementing memory circuitry based on the disclosed technology.

FIG. 14 is a configuration diagram of a memory system based on another implementation of the disclosed technology.

Referring to FIG. 14, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include: one or more columns; and a data line and a data line bar connected with a column selected among the one or more columns. Each of the one or more columns may include a plurality of storage cells each configured to store 1-bit data and each including a first variable resistance element which has a first resistance value when a first value is stored therein and a second resistance value when a second value is stored therein and a second variable resistance element which has the second resistance value when the first value is stored therein and the first resistance value when the second value is stored therein; a bit line connected to one end of the first variable resistance element; a bit line bar connected to one end of the second variable resistance element; a source line connected to the other ends of the first and second variable resistance elements; and a driving block configured to latch data of the data line and the data line bar when a corresponding column is selected and drive the bit line and the bit line bar with a first voltage and a second voltage, respectively, or with the second voltage and the first voltage, respectively, according to a value of the latched data, in a write operation, and latch data corresponding to current flowing through the bit line and the bit line bar in a read operation. Through this, a read margin of the memory 1410 may be improved, speed of read and write operation of the memory unit may be increased, and current and power consumption of the memory 1410 may be decreased. Consequently, operation speed and stability of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include: one or more columns; and a data line and a data line bar connected with a column selected among the one or more columns. Each of the one or more columns may include a plurality of storage cells each configured to store 1-bit data, each storage cell including a first variable resistance element which has a first resistance value when a first value is stored therein and a second resistance value when a second value is stored therein and a second variable resistance element which has the second resistance value when the first value is stored therein and the first resistance value when the second value is stored therein; a bit line connected to one end of the first variable resistance element; a bit line bar connected to one end of the second variable resistance element; a source line connected to the other ends of the first and second variable resistance elements; and a driving block configured to latch data of the data line and the data line bar when a corresponding column is selected, the driving block configured to, in a write operation, drive the bit line and the bit line bar with a first voltage and a second voltage based on a value of the latched data, and the driving block further configured to, in a read operation, latch data corresponding to a current flowing through the bit line and the bit line bar. Through this, a read margin of the buffer memory 1440 may be improved, speed of read and write operation of the memory unit may be increased, and current and power consumption of the buffer memory 1440 may be decreased. Consequently, operation speed and stability of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 10-14 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device including a semiconductor memory unit, the semiconductor memory unit comprising:
   a cell array disposed between a first side and a second side of the cell array that are on opposite sides of the cell array and including first bit lines, first bit line bars, second bit lines, second bit line bars, and a plurality of storage cells which are connected with the first bit lines and the first bit line bars or with the second bit lines and the second bit line bars, and wherein each storage cell is structured to store 1-bit data by including a first variable resistance element having a first resistance value when a first value is stored therein and a second resistance value when a second value is stored therein, and a second variable resistance element having the second resistance value when the first value is stored therein and the first resistance value when the second value is stored therein;
   a first data line and a first data line bar disposed on the first side of the cell array;
   a second data line and a second data line bar disposed on the second side of the cell array;
   one or more first driving blocks disposed on the first side of the cell array and connected to the storage cells through the first bit lines and the first bit line bars, each first driving block configured, during a write operation, to latch data of a corresponding first data line and a corresponding first data line bar and drive the corresponding first bit line and the corresponding first bit line bar with a first voltage or a second voltage according to a value of the latched data and configured, during a read operation, latch data stored in a corresponding storage cell based on a current flowing through the corresponding first bit line and the corresponding first bit line bar; and
   one or more second driving blocks disposed on the second side of the cell array, and connected to storage cells through the second bit lines and the second bit line bars, each second driving block configured, during a write operation, to latch data of a corresponding second data line and a corresponding second data line bar and drive the corresponding second bit line and the corresponding second bit line bar with a first voltage or a second voltage according to a value of the latched data and configured, during a read operation to latch data stored in a corresponding storage cell based on current flowing through the corresponding second bit line and the corresponding second bit line bar,
   wherein each of the first and second driving blocks is further connected to a first driving line and a second driving line, respectively, and configured such that, when a corresponding driving block is selected, the first driving line and the second driving line are connected with a corresponding data line and a corresponding data line bar, respectively, and
   wherein each of the first and second driving blocks drives the bit line through the first driving line and the bit line bar through the second driving line.

2. The electronic device according to claim 1, wherein the semiconductor memory unit comprises a plurality of source lines to which a ground voltage is applied during the read operation and are floated during the write operation, and
   wherein one end of each first variable resistance element is connected to a corresponding bit line, one end of each second variable resistance element is connected to a corresponding bit line bar, and the other ends of the first and second variable resistance elements are connected to a corresponding source line.

3. The electronic device according to claim 2, wherein, in the write operation, resistance values of the first variable resistance element and the second variable resistance element are switched based on directions of currents flowing through the first resistance element and the second resistance element, respectively.

4. The electronic device according to claim 1, wherein the at least one first driving block and the at least one second driving block latch the first value when an amount of current flowing thorough the bit line is greater than an amount of current flowing through the bit line bar, and latch the second value when an amount of current flowing thorough the bit line is smaller than an amount of current flowing through the bit line bar.

5. The electronic device according to claim 1, wherein, in the write operation, each first driving block and each second driving block drive the first driving line with the first voltage and the second driving line with the second voltage when the value of the latched data is the first value, and drive the first driving line with the second voltage and the second driving line with the first voltage when the value of the latched data is the second value.

6. The electronic device according to claim 1, wherein, in the read operation, each first driving block and each second driving block drive the first driving line and the second driving line with the first voltage and the second voltage, respectively, when the amount of current flowing through the bit line is greater than the amount of current flowing through the bit line bar, and drive the first driving line and the second driving line with the second voltage and the first voltage, respectively, when the amount of current flowing through the bit line is smaller than the amount of current flowing through the bit line bar.

7. The electronic device according to claim 1, wherein each of the first and second driving blocks comprises:
   a first PMOS transistor having one end which is connected to the first driving line and the other end which is applied with a power supply voltage, and configured to be turned on and off in response to a voltage of the second driving line;
   a second PMOS transistor having one end which is connected to the second driving line and the other end which is applied with the power supply voltage, and configured to be turned on and off in response to a voltage of the first driving line;
a first NMOS transistor having one end which is connected to the first driving line and the other end which is connected to an internal node, and configured to be turned on and off in response to the voltage of the second driving line;
a second NMOS transistor having one end which is connected to the second driving line and the other end which is connected to the internal node, and configured to be turned on and off in response to the voltage of the first driving line;
a third NMOS transistor having one end which is connected to the internal node and the other end which is applied with the ground voltage, and configured to be turned on and off in response to an enable signal which is activated during an activation period of the driving block and is deactivated during a deactivation period of the driving block; and
a third PMOS transistor having one end which is connected to the first driving line and the other end which is connected to the second driving line, and configured to be turned on and off in response to the enable signal.

8. The electronic device according to claim 7, wherein the third PMOS transistor turns off when the enable signal is activated, and turns on when the enable signal is deactivated.

9. The electronic device according to claim 1, wherein the first variable resistance element and the second variable resistance element include at least one of a metal oxide and a structure in which a tunnel barrier layer is interposed between two ferromagnetic layers.

10. The electronic device according to claim 1, further comprising a microprocessor which includes:
a control unit that is configured to receive a signal including a command from an outside of the microprocessor, and performs extracting, decoding of the command, or controlling input or output of a signal of microprocessor; and
an operation unit configured to perform an operation based on a result that the control unit decodes the command; and
a memory unit configured to store data for performing the operation, data corresponding to a result of performing the operation, or an address of data for which the operation is performed,
wherein the semiconductor memory unit that includes the variable resistance element is part of the memory unit in the microprocessor.

11. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory unit that includes the variable resistance element is part of the cache memory unit in the processor.

12. The electronic device according to claim 1, further comprising a processing system which includes:

a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between the processor, the auxiliary memory device or the main memory device and the outside,
wherein the semiconductor memory unit that includes the variable resistance element is part of the auxiliary memory device or the main memory device in the processing system.

13. The electronic device according to claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory unit that includes the variable resistance element is part of the storage device or the temporary storage device in the data storage system.

14. The electronic device according to claim 1, further comprising a memory system which includes:
a memory configured to store data and conserve stored data regardless of power supply;
a memory controller configured to control input and output of data to and from the memory according to a command inputted form an outside;
a buffer memory configured to buffer data exchanged between the memory and the outside; and
an interface configured to perform communication between at least one of the memory, the memory controller and the buffer memory and the outside,
wherein the semiconductor memory unit that includes the variable resistance element is part of the memory or the buffer memory in the memory system.

15. The electronic device according to claim 1, wherein the first bit lines and the first bit line bars are disposed on the first side of the cell array and the second bit lines and the second bit line bars are disposed on the second side of the cell array.

16. The electronic device according to claim 1, wherein each of the first and second variable resistance elements in each storage cell include a magnetic tunnel junction (MTJ) element that includes two ferromagnetic layers and a tunneling barrier layer interposed between the two ferromagnetic layers.

17. The electronic device according to claim 1, wherein the first variable resistance element or the second variable resistance element in each storage cell includes an RRAM (resistive random access memory) element, a PRAM (phase change random access memory) element, or an FRAM (ferroelectric random access memory) element.

18. An electronic device including a semiconductor memory unit, the semiconductor memory unit comprising:
- a cell array disposed between a first side and a second side of the cell array that are on opposite sides of the cell array and including first bit lines, first bit line bars, second bit lines, second bit line bars, and a plurality of storage cells which are connected with the first bit lines and the first bit line bars or with the second bit lines and the second bit line bars, and wherein each storage cell is structured to store 1-bit data by including a first variable resistance element having a first resistance value when a first value is stored therein and a second resistance value when a second value is stored therein, and a second variable resistance element having the second resistance value when the first value is stored therein and the first resistance value when the second value is stored therein;
- a first data line and a first data line bar disposed on the first side of the cell array;
- a second data line and a second data line bar disposed on the second side of the cell array;
- one or more first driving blocks disposed on the first side of the cell array and connected to the storage cells through the first bit lines and the first bit line bars, each first driving block configured, during a write operation, to latch data of a corresponding first data line and a corresponding first data line bar and drive the corresponding first bit line and the corresponding first bit line bar with a first voltage or a second voltage according to a value of the latched data and configured, during a read operation, latch data stored in a corresponding storage cell based on a current flowing through the corresponding first bit line and the corresponding first bit line bar; and
- one or more second driving blocks disposed on the second side of the cell array, and connected to storage cells through the second bit lines and the second bit line bars, each second driving block configured, during a write operation, to latch data of a corresponding second data line and a corresponding second data line bar and drive the corresponding second bit line and the corresponding second bit line bar with a first voltage or a second voltage according to a value of the latched data and configured, during a read operation to latch data stored in a corresponding storage cell based on current flowing through the corresponding second bit line and the corresponding second bit line bar, wherein each of the first and second driving blocks is further connected to a first driving line and a second driving line, respectively and drives the first driving line and the second driving line with same voltage level during a precharge period.

* * * * *